United States Patent [19]

Dennen

[11] Patent Number: 5,698,884
[45] Date of Patent: Dec. 16, 1997

[54] SHORT CHANNEL FERMI-THRESHOLD FIELD EFFECT TRANSISTORS INCLUDING DRAIN FIELD TERMINATION REGION AND METHODS OF FABRICATING SAME

[75] Inventor: Michael W. Dennen, Raleigh, N.C.

[73] Assignee: Thunderbird Technologies, Inc., Research Triangle Park, N.C.

[21] Appl. No.: 597,711

[22] Filed: Feb. 7, 1996

[51] Int. Cl.[6] .................. H01L 29/76; H01L 29/94; H01L 31/062; H01L 31/113
[52] U.S. Cl. .................. 257/345; 257/297; 257/346
[58] Field of Search .................. 257/345, 297, 257/346

[56] References Cited

U.S. PATENT DOCUMENTS

| | | | |
|---|---|---|---|
| 4,984,043 | 1/1991 | Vinal | 357/23.14 |
| 4,990,974 | 2/1991 | Vinal | 357/23.3 |
| 5,194,923 | 3/1993 | Vinal | 257/268 |
| 5,369,295 | 11/1994 | Vinal | 257/288 |
| 5,374,836 | 12/1994 | Vinal | 257/344 |
| 5,384,476 | 1/1995 | Nishizawa et al. | 257/345 |
| 5,583,361 | 12/1996 | Morishita | 257/345 |

OTHER PUBLICATIONS

Oka et al., "Two-Dimensional Analysis of Normally-Off Type Buried Channel MOSFETs", IEDM 25, Washington, DC, Dec. 3–5, 1979, pp. 30–33.

Lee et al., "Room Temperature 0.1 μm CMOS Technology with 11.8 ps Gate Delay", IEDM, 1993, pp.131–134.
Yan et al., "Scaling the Si MOSFET: From Bulk to SOI to Bulk", IEEE Transactions on Electron Devices, vol. 39, No. 7, Jul. 1992, pp. 1704–1710.
Cham et al., "Device Design for the Submicrometer p–Channel FET with $n^+$ Polysilicon Gate", IEEE, 1984, pp. 964–965.

Primary Examiner—Stephen Meier
Attorney, Agent, or Firm—Myers Bigel Sibley & Sajovec, L.L.P.

[57] ABSTRACT

A Fermi-FET includes a drain field termination region between the source and drain regions, to reduce and preferably prevent injection of carriers from the source region into the channel as a result of drain bias. The drain field terminating region prevents excessive drain induced barrier lowering while still allowing low vertical field in the channel. The drain field terminating region is preferably embodied by a buried counterdoped layer between the source and drain regions, extending beneath the substrate surface from the source region to the drain region. The buried counterdoped layer may be formed using a three tub structure which produces three layers between the spaced apart source and drain regions. The drain field terminating region may also be used in a conventional MOSFET. The channel region is preferably formed by epitaxial deposition, so that the channel region need not be counterdoped relative to the drain field terminating region. Higher carrier mobility in the channel may thereby be obtained for a given doping level.

14 Claims, 19 Drawing Sheets

SHORT CHANNEL FERMI-THRESHOLD FIELD EFFECT TRANSISTORS INCLUDING DRAIN FIELD TERMINATION REGION AND METHODS OF FABRICATING SAME

FIELD OF THE INVENTION

This invention relates to field effect transistor devices and more particularly to integrated circuit field effect transistors and methods of fabricating same.

BACKGROUND OF THE INVENTION

Field effect transistors (FET) have become the dominant active device for very large scale integration (VLSI) and ultra large scale integration (ULSI) applications, such as logic devices, memory devices and microprocessors, because the integrated circuit FET is by nature a high impedance, high density, low power device. Much research and development activity has focused on improving the speed and integration density of FETs, and on lowering the power consumption thereof.

A high speed, high performance field effect transistor is described in U.S. Pat. Nos. 4,984,043 and 4,990,974, both by Albert W. Vinal, both entitled *Fermi Threshold Field Effect Transistor* and both assigned to the assignee of the present invention. These patents describe a metal oxide semiconductor field effect transistor (MOSFET) which operates in the enhancement mode without requiring inversion, by setting the device's threshold voltage to twice the Fermi potential of the semiconductor material. As is well known to those having skill in the art, Fermi potential is defined as that potential for which an energy state in a semiconductor material has a probability of one-half of being occupied by an electron. As described in the above mentioned Vinal patents, when the threshold voltage is set to twice the Fermi potential, the dependence of the threshold voltage on oxide thickness, channel length, drain voltage and substrate doping is substantially eliminated. Moreover, when the threshold voltage is set to twice the Fermi potential, the vertical electric field at the substrate face between the oxide and channel is minimized, and is in fact substantially zero. Carrier mobility in the channel is thereby maximized, leading to a high speed device with greatly reduced hot electron effects. Device performance is substantially independent of device dimensions.

Notwithstanding the vast improvement of the Fermi-threshold FET compared to known FET devices, there was a need to lower the capacitance of the Fermi-FET device. Accordingly, in U.S. Pat. Nos. 5,194,923 and 5,369,295, both by Albert W. Vinal, and both entitled *Fermi Threshold Field Effect Transistor With Reduced Gate and Diffusion Capacitance*, a Fermi-FET device is described which allows conduction carriers to flow within the channel at a predetermined depth in the substrate below the gate, without requiring an inversion layer to be created at the surface of the semiconductor in order to support carrier conduction. Accordingly, the average depth of the channel charge requires inclusion of the permittivity of the substrate as part of the gate capacitance. Gate capacitance is thereby substantially reduced.

As described in the aforesaid '295 and '923 patents, the low capacitance Fermi-FET is preferably implemented using a Fermi-tub region having a predetermined depth and a conductivity type opposite the substrate and the same conductivity type as the drain and source. The Fermi-tub extends downward from the substrate surface by a predetermined depth, and the drain and source diffusions are formed in the Fermi-tub within the tub boundaries. The Fermi-tub forms a unijunction transistor, in which the source, drain, channel and Fermi-tub are all doped the same conductivity type, but at different doping concentrations. A low capacitance Fermi-FET is thereby provided. The low capacitance Fermi-FET including the Fermi-tub will be referred to herein as a "low capacitance Fermi-FET" or a "Tub-FET".

Notwithstanding the vast improvement of the Fermi-FET and the low capacitance Fermi-FET compared to known FET devices, there was a continuing need to increase the current per unit channel width which is produced by the Fermi-FET. As is well known to those skilled in the art, higher current Fermi-FET devices will allow greater integration density, and/or much higher speeds for logic devices, memory devices, microprocessors and other integrated circuit devices. Accordingly, U.S. Pat. No. 5,374,836 to Albert W. Vinal and the present inventor entitled *High Current Fermi-Threshold Field Effect Transistor*, describes a Fermi-FET which includes an injector region of the same conductivity type as the Fermi-tub region and the source region, adjacent the source region and facing the drain region. The injector region is preferably doped at a doping level which is intermediate to the relatively low doping concentration of the Fermi-tub and the relatively high doping concentration of the source. The injector region controls the depth of the carriers injected into the channel and enhances injection of carriers in the channel, at a predetermined depth below the gate. Transistors according to U.S. Pat. No. 5,374,836 will be referred to herein as a "high current Fermi-FET".

Preferably, the source injector region is a source injector tub region which surrounds the source region. A drain injector tub region may also be provided. A gate sidewall spacer which extends from adjacent the source injector region to adjacent the gate electrode of the Fermi-FET may also be provided in order to lower the pinch-off voltage and increase saturation current for the Fermi-FET. A bottom leakage control region of the same conductivity type as the substrate may also be provided.

Notwithstanding the vast improvement of the Fermi-FET, the low capacitance Fermi-FET and the high current Fermi-FET compared to known FET devices, there was a continuing need to improve operation of the Fermi-FET at low voltages. As is well known to those having skill in the art, there is currently much emphasis on low power portable and/or battery-powered devices which typically operate at power supply voltages of five volts, three volts, one volt or less.

For a given channel length, lowering of the operating voltage causes the lateral electric field to drop linearly. At very low operating voltages, the lateral electric field is so low that the carriers in the channel are prevented from reaching saturation velocity. This results in a precipitous drop in the available drain current. The drop in drain current effectively limits the decrease in operating voltage for obtaining usable circuit speeds for a given channel length.

In order to improve operation of the Tub-FET at low voltages, application Ser. No. 08/351,643 to the present inventor entitled *Contoured-Tub Fermi-Threshold Field Effect Transistor and Method of Forming Same*, describes a Fermi-FET which includes a contoured Fermi-tub region having nonuniform tub depth. In particular, the Fermi-tub is deeper under the source and/or drain regions than under the channel region. Thus, the tub-substrate junction is deeper under the source and/or drain regions than under the channel region. Diffusion capacitance is thereby reduced compared to a Fermi-tub having a uniform tub depth, so that high saturation current is produced at low voltages.

In particular, a contoured-tub Fermi-threshold field effect transistor according to application Ser. No. 08/351,643 includes a semiconductor substrate of first conductivity type and spaced-apart source and drain regions of second conductivity type in the semiconductor substrate at a face thereof. A channel region of the second conductivity type is also formed in the semiconductor substrate at the substrate face between the spaced-apart source and drain regions. A tub region of the second conductivity type is also included in the semiconductor substrate at the substrate face. The tub region extends a first predetermined depth from the substrate face to below at least one of the spaced-apart source and drain regions, and extends a second predetermined depth from the substrate face to below the channel region. The second predetermined depth is less than the first predetermined depth. A gate insulating layer and source, drain and gate contacts are also included. A substrate contact may also be included.

Preferably, the second predetermined depth, i.e. the depth of the contoured-tub adjacent the channel, is selected to satisfy the Fermi-FET criteria as defined in the aforementioned U.S. Pat. Nos. 5,194,923 and 5,369,295. In particular, the second predetermined depth is selected to produce zero static electric field perpendicular to the substrate face at the bottom of the channel with the gate electrode at ground potential. The second predetermined depth may also be selected to produce a threshold voltage for the field effect transistor which is twice the Fermi potential of the semiconductor substrate. The first predetermined depth, i.e. the depth of the contoured-tub region adjacent the source and/or drain is preferably selected to deplete the tub region under the source and/or drain regions upon application of zero bias to the source and/or drain contact.

As the state of the art in microelectronic fabrication has progressed, fabrication linewidths have been reduced to substantially less than one micron. These decreased linewidths have given rise to the "short channel" FET wherein the channel length is substantially less than one micron and is generally less than one half micron with current processing technology.

The low capacitance Fermi-FET of U.S. Pat. Nos. 5,194, 923 and 5,369,295, the high current Fermi-FET of U.S. Pat. No. 5,374,836 and the contoured tub Fermi-FET of application Ser. No. 08/351,643 may be used to provide a short channel FET with high performance capabilities at low voltages. However, it will be recognized by those having skill in the art that as linewidths decrease, processing limitations may limit the dimensions and conductivities which are attainable in fabricating an FET. Accordingly, for decreased linewidths, processing conditions may require reoptimization of the Fermi-FET transistor to accommodate these processing limitations.

Reoptimization of the Fermi-FET transistor to accommodate processing limitations was provided in application Ser. No. 08/505,085 to the present inventor and entitled "*Short Channel Fermi-Threshold Field Effect Transistors*", assigned to the assignee of the present invention, the disclosure of which is hereby incorporated herein by reference. The Short Channel Fermi-FET of application Ser. No. 08/505,085, referred to herein as the "short channel Fermi-FET", includes spaced-apart source and drain regions which extend beyond the Fermi-tub in the depth direction and which may also extend beyond the Fermi-tub in the lateral direction. Since the source and drain regions extend beyond the tub, a junction with the substrate is formed which can lead to a charge-sharing condition. In order to compensate for this condition, the substrate doping is increased. The very small separation between the source and drain regions leads to a desirability to reduce the tub depth. This causes a change in the static electrical field perpendicular to the substrate at the oxide:substrate interface when the gate electrode is at threshold potential. In typical long channel Fermi-FET transistors, this field is essentially zero. In short channel devices the field is significantly lower than a MOSFET transistor, but somewhat higher than a long channel Fermi-FET.

In particular, a short channel Fermi-FET includes a semiconductor substrate of first conductivity type and a tub region of second conductivity type in the substrate at a surface thereof which extends a first depth from the substrate surface. The short channel Fermi-FET also includes spaced-apart source and drain regions of the second conductivity type in the tub region. The spaced-apart source and drain regions extend from the substrate surface to beyond the first depth, and may also extend laterally away from one another to beyond the tub region.

A channel region of the second conductivity type is included in the tub region, between the spaced-apart source and drain regions and extending a second depth from the substrate surface such that the second depth is less than the first depth. At least one of the first and second depths are selected to minimize the static electric field perpendicular to the substrate surface, from the substrate surface to the second depth when the gate electrode is at threshold potential. For example, a static electric field of $10^4$ V/cm may be produced in a short channel Fermi-FET compared to a static electric field of more than $10^5$ V/cm in a conventional MOSFET. In contrast, the Tub-FET of U.S. Pat. Nos. 5,194,923 and 5,369,295 may produce a static electric field of less than (and often considerably less than) $10^3$ V/cm which is essentially zero when compared to a conventional MOSFET. The first and second depths may also be selected to produce a threshold voltage for the field effect transistor which is twice the Fermi-potential of the semiconductor substrate, and may also be selected to allow carriers of the second conductivity type to flow from the source region to the drain region in the channel region at the second depth upon application of the threshold voltage to the gate electrode, and extending from the second depth toward the substrate surface upon application of voltage to the gate electrode beyond the threshold voltage of the field effect transistor, without creating an inversion layer in the channel. The transistor further includes a gate insulating layer and source, drain and gate contacts. A substrate contact may also be included.

Continued miniaturization of integrated circuit field effect transistors has reduced the channel length to well below one micron. This continued miniaturization of the transistor has often required very high substrate doping levels. High doping levels and the decreased operating voltages which may be required by the smaller devices, may cause a large increase in the capacitance associated with the source and drain regions of both the Fermi-FET and conventional MOSFET devices.

In particular, as the Fermi-FET is scaled to below one micron, it is typically necessary to make the tub depth substantially shallower due to increased Drain Induced Barrier Lowering (DIBL) at the source. Unfortunately, even with the changes described above for the short channel Fermi-FET, the short channel Fermi-FET may reach a size where the depths and doping levels which are desired to control Drain Induced Barrier Lowering and transistor leakage become difficult to manufacture. Moreover, the high doping levels in the channel may reduce carrier mobility which also may reduce the high current advantage of the Fermi-FET technology. The ever higher substrate doping levels, together with the reduced drain voltage may also cause an increase in the junction capacitance.

SUMMARY OF THE INVENTION

It is therefore an object of the invention to provide improved Fermi-threshold field effect transistors (Fermi-FET).

It is another object of the invention to provide improved metal oxide semiconductor field effect transistors (MOSFET).

It is still another object of the present invention to provide improved Fermi-FETs and MOSFETs which are adapted for short channel lengths.

It is still another object of the invention to provide short channel Fermi-FETs and MOSFETs which do not require high doping levels in the channel and do not require ultra-shallow tub depths.

It is yet another object of the present invention to provide methods of fabricating short-channel Fermi-FETs and MOSFETs.

These and other objects are provided, according to the present invention, by a Fermi-FET which includes drain field terminating means between the source and drain regions for reducing and preferably preventing injection of carriers from the source region into the channel as a result of drain bias. A short channel Fermi-FET including drain field terminating means, referred to herein as a "Vinal-FET" in memory of the now deceased inventor of the Fermi-FET, prevents excessive Drain Induced Barrier Lowering while still allowing low vertical field in the channel, similar to a Fermi-FET. In addition, the Vinal-FET permits much higher carrier mobility and simultaneously leads to a large reduction in source and drain junction capacitance.

The drain field terminating means is preferably embodied by a buried counterdoped layer between the source and drain regions and extending beneath the substrate surface from the source region to the drain region. In particular, a Vinal-FET includes a semiconductor substrate of first conductivity type and a tub region of second conductivity type in the substrate at a surface thereof. Spaced apart source and drain regions of the second conductivity type are included in the tub region at the substrate surface. A buried drain field terminating region of the first conductivity type is also included in the tub region. The buried drain field terminating region extends beneath the substrate surface from the source region to the drain region. A gate insulating layer and source, drain and gate electrodes are also included. Accordingly, the Vinal-FET may be regarded as a Fermi-FET with an added counterdoped buried drain field terminating region which prevents drain bias from causing carriers to be injected from the source region into the tub region.

The Vinal-FET structure may also be regarded as a three-tub structure. In particular, a semiconductor substrate of first conductivity type includes a first tub region of second conductivity type at a surface thereof and extending into the substrate a first depth from the substrate surface. A second tub region of the first conductivity type is included in the first tub region and extends into the substrate a second depth from the substrate surface, wherein the second depth is less than the first depth. A third tub region of the second conductivity type is included in the second tub region and extends into the substrate a third depth from the substrate surface, wherein the third depth is less than the second depth. Spaced apart source and drain regions of the second conductivity type are included in the first tub region and extend into the substrate a fourth depth from the substrate surface, wherein the fourth depth is greater than the third depth. A gate insulating layer and source, drain and gate electrodes are also provided. In one embodiment of the transistor, the source and drain regions project into the substrate to a fourth depth which is greater than the third depth but less than the second depth. In another embodiment, the source and drain regions project into the substrate a fourth depth which is greater than the second depth but less than the first depth.

The Vinal-FET may also be regarded as a field effect transistor having three distinct layers extending between spaced apart source and drain regions of second conductivity type in a substrate of first conductivity type. A first layer of the second conductivity type extends from the source region to the drain region and extends into the substrate a first depth from the substrate surface. A second layer of first conductivity type in the substrate extends from the source region to the drain region and extends into the substrate from the first depth to a second depth from the substrate surface. A third layer of the second conductivity type extends from the source region to the drain region and extends into the substrate from the second depth to the third depth from the substrate surface. In the first embodiment of the Vinal-FET, the source and drain regions include source and drain bottoms in the semiconductor substrate, and both the second and third layers extend from the source bottom to the drain bottom. In the second embodiment, only the third layer extends from the source bottom to the drain bottom, and the second layer extends from the source sidewall to the drain sidewall.

The drain field terminating means, embodied as a buried region of first conductivity type in the tub region, a second tub region of first conductivity type in the first tub region, or a second layer of first conductivity type extending between the source and drain, prevents excessive drain induced barrier lowering while still allowing the lowered vertical field in the channel of a Fermi-FET. Higher carrier mobility and a large reduction in source and drain junction capacitance is provided.

The drain field terminating means of the Vinal-FET may also be used in a conventional MOSFET to provide at least some of the above-described advantages. In particular, a conventional MOSFET may include a semiconductor substrate of first conductivity type and spaced-apart source and drain regions of second conductivity type in the substrate at a surface thereof. A first layer of the first conductivity type is included in the substrate at the substrate surface extending from the source region to the drain region and extending into the substrate a first depth from the substrate surface. A second layer of the second conductivity type is included in the substrate extending from the source region to the drain region and extending into the substrate from the first depth to a second depth from the substrate surface. The second layer or the first and second layers may also extend from the source bottom to the drain bottom to define first and second tub regions respectively.

Preferred methods of making the Vinal-FET epitaxially form the third tub region (or first layer) so that it need not be counterdoped relative to the drain field terminating region (or second tub or second layer). By epitaxially forming the third tub or first layer, higher carrier mobility may be obtained for a given doping level. Accordingly, preferred methods of forming the Vinal-FET includes the steps of implanting the first tub region in the substrate surface and implanting the second tub region in the first tub region. An epitaxial deposition is then performed and either in situ doped or implanted, to form the third tub region within the second tub region. A polycrystalline silicon gate is then formed using conventional techniques and the source and drain regions are implanted. Increased carrier mobility in the channel is thereby provided.

DETAILED DESCRIPTION OF PREFERRED EMBODIMENTS

Figure 1:
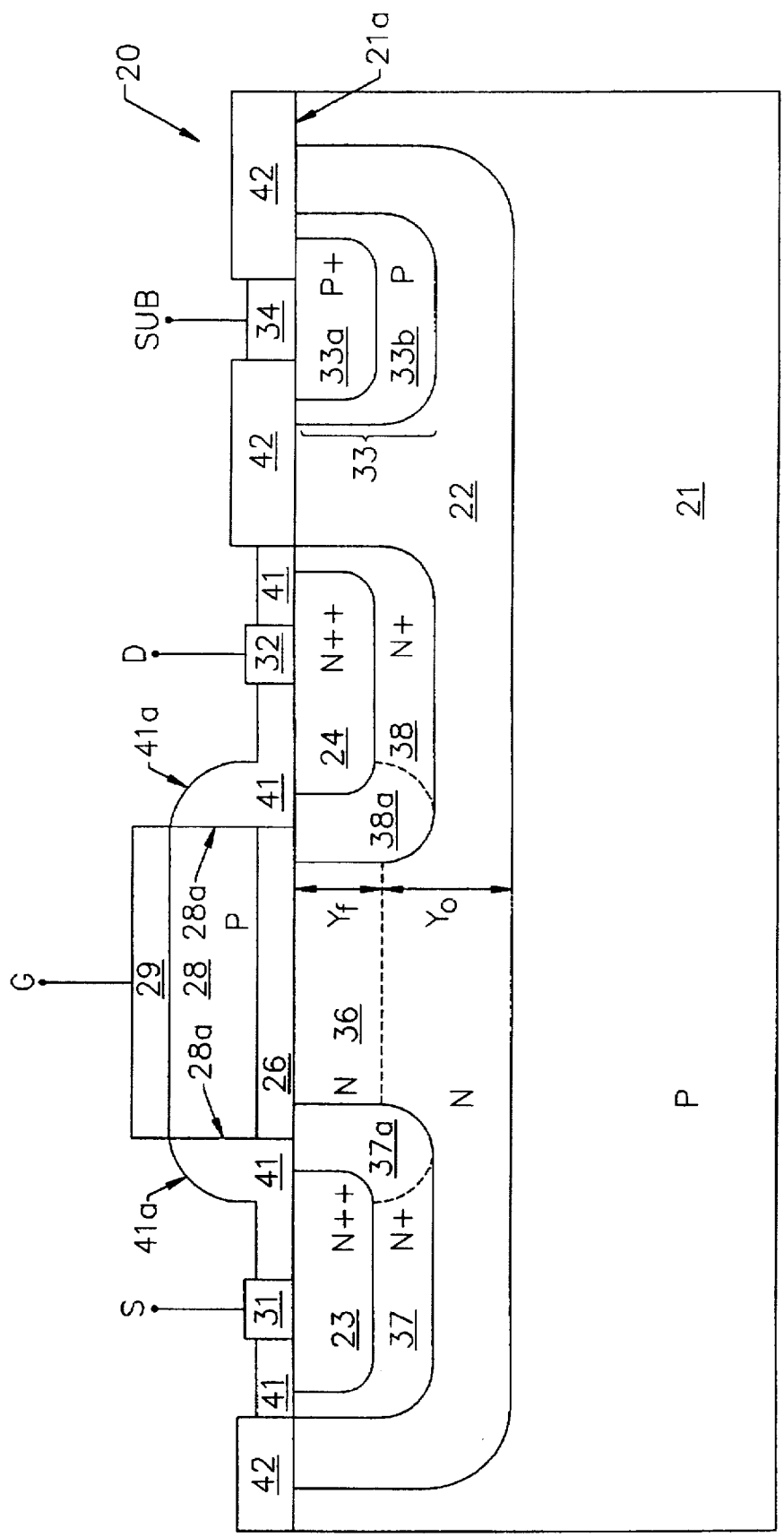
FIG. 1 illustrates a cross-sectional view of an N-channel high current Fermi-FET according to application Ser. No. 08/037,636.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Before describing a short channel Fermi-threshold field effect transistor including a drain field termination region (also referred to as a "Vinal-FET") of the present invention, a Fermi-threshold field effect transistor with reduced gate and diffusion capacitance of U.S. Pat. Nos. 5,194,923 and 5,369,295 (also referred to as the "low capacitance Fermi-FET" or the "Tub-FET") will be described as will a high current Fermi-Threshold field effect transistor of U.S. Pat. No. 5,374,836. A contoured-tub Fermi-FET according to application Ser. No. 08/351,643 will also be described. Short channel Fermi-FETs of application Ser. No. 08/505,085 will also be described. A more complete description may be found in these patents and applications, the disclosures of which are hereby incorporated herein by reference. Vinal-FETs according to the present invention will then be described.

Fermi-FET With Reduced Gate and Diffusion Capacitance

The following summarizes the low capacitance Fermi-FET including the Fermi-tub. Additional details may be found in U.S. Pat. Nos. 5,194,923 and 5,369,295.

Conventional MOSFET devices require an inversion layer to be created at the surface of the semiconductor in order to support carrier conduction. The depth of the inversion layer is typically 100 Å or less. Under these circumstances gate capacitance is essentially the permittivity of the gate insulator layer divided by its thickness. In other words, the channel charge is so close to the surface that effects of the dielectric properties of the substrate are insignificant in determining gate capacitance.

Gate capacitance can be lowered if conduction carriers are confined within a channel region below the gate, where the average depth of the channel charge requires inclusion of the permittivity of the substrate to calculate gate capacitance. In general, the gate capacitance of the low capacitance Fermi-FET is described by the following equation:

$$C_g = \frac{1}{\frac{Y_f}{\beta \epsilon_s} + \frac{T_{ox}}{\epsilon_i}} \tag{1}$$

Where $Y_f$ is the depth of the conduction channel called the Fermi channel, $\epsilon_s$ is the permittivity of the substrate, and $\beta$ is the factor that determines the average depth of the charge flowing within the Fermi channel below the surface. $\beta$ depends on the depth dependant profile of carriers injected from the source into the channel. For the low capacitance Fermi-FET, $\beta \approx 2$. $T_{ox}$ is the thickness of the gate oxide layer and $\epsilon_i$ is its permittivity.

The low capacitance Fermi-FET includes a Fermi-tub region of predetermined depth, having conductivity type opposite the substrate conductivity type and the same conductivity type as the drain and source regions. The Fermi-tub extends downward from the substrate surface by a predetermined depth, and the drain and source diffusions are formed in the Fermi-tub region within the Fermi-tub boundaries. The preferred Fermi-tub depth is the sum of the Fermi channel depth $Y_f$ and depletion depth $Y_0$. A Fermi channel region with predetermined depth $Y_f$ and width Z, extends between the source and drain diffusions. The conductivity of the Fermi channel is controlled by the voltage applied to the gate electrode.

The gate capacitance is primarily determined by the depth of the Fermi channel and the carrier distribution in the Fermi channel, and is relatively independent of the thickness of the gate oxide layer. The diffusion capacitance is inversely dependant on the difference between [the sum of the depth of the Fermi-tub and the depletion depth $Y_0$ in the substrate] and the depth of the diffusions $X_d$. The diffusion depth is preferably less than the depth of the Fermi-tub, $Y_T$. The dopant concentration for the Fermi-tub region is preferably chosen to allow the depth of the Fermi channel to be greater than three times the depth of an inversion layer within a MOSFET.

Accordingly, the low capacitance Fermi-FET includes a semiconductor substrate of first conductivity type having a first surface, a Fermi-tub region of second conductivity type in the substrate at the first surface, spaced apart source and drain regions of the second conductivity type in the Fermi-tub region at the first surface, and a channel of the second conductivity type in the Fermi-tub region at the first surface between the spaced apart source and drain regions. The channel extends a first predetermined depth ($Y_f$) from the first surface and the tub extends a second predetermined depth ($Y_0$) from the channel. A gate insulating layer is provided on the substrate at the first surface between the spaced apart source and drain regions. Source, drain and gate electrodes are provided for electrically contacting the source and drain regions and the gate insulating layer respectively.

At least the first and second predetermined depths are selected to produce zero static electric field perpendicular to the first surface at the first depth, upon application of the threshold voltage of the field effect transistor to the gate electrode. The first and second predetermined depths are also selected to allow carriers of the second conductivity type to flow from the source to the drain in the channel, extending from the first predetermined depth toward the first surface upon application of the voltage to the gate electrode beyond the threshold voltage of the field effect transistor. The carriers flow from the source to the drain region beneath the first surface without creating an inversion layer in the Fermi-tub region. The first and second predetermined depths are also selected to produce a voltage at the substrate surface, adjacent the gate insulating layer, which is equal and opposite to the sum of the voltages between the substrate contact and the substrate and between the polysilicon gate electrode and the gate electrode.

When the substrate is doped at a doping density $N_s$, has an intrinsic carrier concentration $n_i$ at temperature T degrees Kelvin and a permittivity $\epsilon_s$, and the field effect transistor includes a substrate contact for electrically contacting the substrate, and the channel extends a first predetermined depth $Y_f$ from the surface of the substrate and the Fermi-tub region extends a second predetermined depth $Y_0$ from the channel, and the Fermi-tub region is doped at a doping density which is a factor $\alpha$ times $N_s$, and the gate electrode includes a polysilicon layer of the first conductivity type and which is doped at a doping density $N_p$, the first predetermined depth ($Y_f$) is equal to:

$$Y_f = \sqrt{\frac{2\epsilon_s}{qN_s\alpha} \cdot \frac{kT}{q} Ln\left(\frac{N_p}{N_s}\right)}, \quad (2)$$

where q is $1.6\times10^{-19}$ coulombs and K is $1.38\times10^{-23}$ Joules/°Kelvin. The second predetermined depth ($Y_0$) is equal to:

$$Y_o = \sqrt{\frac{2\epsilon_s\phi_s}{qN_s\alpha(\alpha+1)}}, \quad (3)$$

where $\phi_s$ is equal to $2\phi_f + kT/q\ Ln(\alpha)$, and $\phi_f$ is the Fermi potential of the semiconductor substrate.

High Current Fermi-FET Structure

Referring now to FIG. 1, an N-channel high current Fermi-FET according to U.S. Pat. No. 5,374,836 is illustrated. It will be understood by those having skill in the art that a P-channel Fermi-FET may be obtained by reversing the conductivities of the N and P regions.

As illustrated in FIG. 1, high current Fermi-FET 20 is fabricated in a semiconductor substrate 21 having first conductivity type, here P-type, and including a substrate surface 21a. A Fermi-tub region 22 of second conductivity type, here N-type, is formed in the substrate 21 at the surface 21a. Spaced apart source and drain regions 23 and 24, respectively, of the second conductivity type, here N-type, are formed in the Fermi-tub region 22 at the surface 21a. It will be understood by those having skill in the art that the source and drain regions may also be formed in a trench in the surface 21a.

A gate insulating layer 26 is formed on the substrate 21 at the surface 21a between the spaced apart source and drain regions 23 and 24, respectively. As is well known to those having skill in the art, the gate insulating layer is typically silicon dioxide. However, silicon nitride and other insulators may be used.

A gate electrode is formed on gate insulating layer 26, opposite the substrate 21. The gate electrode preferably includes a polycrystalline silicon (polysilicon) gate electrode layer 28 of first conductivity type, here P-type. A conductor gate electrode layer, typically a metal gate electrode layer 29, is formed on polysilicon gate electrode 28 opposite gate insulating layer 26. Source electrode 31 and drain electrode 32, typically metal, are also formed on source region 23 and drain region 24, respectively.

A substrate contact 33 of first conductivity type, here P-type, is also formed in substrate 21, either inside Fermi-tub 22 as shown or outside tub 22. As shown, substrate contact 33 is doped first conductivity type, here P-type, and may include a relatively heavily doped region 33a and a relatively lightly doped region 33b. A substrate electrode 34 establishes electrical contact to the substrate.

The structure heretofore described with respect to FIG. 1 corresponds to the low capacitance Fermi-FET structure of U.S. Pat. Nos. 5,194,923 and 5,369,295. As already described in these applications, a channel 36 is created between the source and drain regions 23 and 24. The depth of the channel from the surface 21a, designated at $Y_f$ in FIG. 1, and the depth from the bottom of the channel to the bottom of the Fermi-tub 22, designated as $Y_0$ in FIG. 1, along with the doping levels of the substrate 21, tub region 22, and polysilicon gate electrode 28 are selected to provide a high performance, low capacitance field effect transistor using the relationships of Equations (2) and (3) above.

Still referring to FIG. 1, a source injector region 37a of second conductivity type, here N-type, is provided adjacent the source region 23 and facing the drain region. The source injector region provides a high current, Fermi-FET by controlling the depth at which carriers are injected into channel 36. The source injector region 37a may only extend between the source region 23 and the drain region 24. The source injector region preferably surrounds source region 23 to form a source injector tub region 37, as illustrated in FIG. 1. Source region 23 may be fully surrounded by the source injector tub region 37, on the side and bottom surface. Alternatively, source region 23 may be surrounded by the source injector tub region 37 on the side, but may protrude through the source injector tub region 37 at the bottom. Still alternatively, source injector region 37a may extend into substrate 21, to the junction between Fermi-tub 22 and substrate 21. A drain injector region 38a, preferably a drain injector tub region 38 surrounding drain region 24, is also preferably provided.

Source injector region 37a and drain injector region 38a or source injector tub region 37 and drain injector tub region 38, are preferably doped the second conductivity type, here N-type, at a doping level which is intermediate the relatively low doping level of Fermi-tub 22 and the relatively high doping level of source 23 and drain 24. Accordingly, as illustrated in FIG. 1, Fermi-tub 22 is designated as being N, source and drain injector tub regions 37, 38 are designated as $N^+$ and source and drain regions 23, 24 are designated as $N^{++}$. A unijunction transistor is thereby formed.

The high current Fermi-FET provides drive currents that are about four times that of state of the art FETs. Gate capacitance is about half that of a conventional FET device. The doping concentration of the source injector tub region 37 controls the depth of carriers injected into the channel region 36, typically to about 1000 Å. The source injector tub region 37 doping concentration is typically 2E18, and preferably has a depth at least as great as the desired maximum depth of injected majority carriers. Alternatively, it may extend as deep as the Fermi-tub region 22 to minimize subthreshold leakage current, as will be described below. It will be shown that the carrier concentration injected into the channel 36 cannot exceed the doping concentration of the source injector region 37a facing the drain. The width of the portion of source injector region 37a facing the drain is typically in the range of 0.05–0.15µm. The doping concentration of the source and drain regions 23 and 24 respectively, is typically 1E19 or greater. The depth $Y_T = (Y_f + Y_0)$ of the Fermi-tub 22 is approximately 2200 Å with a doping concentration of approximately 1.8E16.

As illustrated in FIG. 1, the high current Fermi-FET 20 also includes a gate sidewall spacer 41 on the substrate surface 21a, which extends from adjacent the source injector region 37a to adjacent the polysilicon gate electrode 28. Gate sidewall spacer 41 also preferably extends from adjacent the drain injector region 38a to adjacent the polysilicon gate electrode 28. In particular, as shown in FIG. 1, gate sidewall spacer 41 extends from the polysilicon gate electrode sidewall 28a and overlies the source and drain injector regions 37a and 38a respectively. Preferably the gate sidewall spacer 41 surrounds the polysilicon gate electrode 28. Also preferably, and as will be discussed in detail below, the gate insulating layer 26 extends onto the source injector region 37a and the drain injector region 38a at the substrate face 21a and the gate sidewall spacer 41 also extends onto the source injector region 37 and drain injector region 38.

The gate sidewall spacer 41 lowers the pinch-off voltage of the Fermi-FET 20 and increases its saturation current in a manner in which will be described in detail below. Preferably, the gate sidewall spacer is an insulator having a permittivity which is greater than the permittivity of the gate insulating layer 26. Thus, for example, if the gate insulating layer 26 is silicon dioxide, the gate sidewall spacer is preferably silicon nitride. If the gate insulating layer 26 is silicon nitride, the gate sidewall spacer is preferably an insulator which has permittivity greater than silicon nitride.

As shown in FIG. 1, the gate sidewall spacer 41 may also extend onto source and drain regions 23 and 24 respectively, and the source and drain. electrodes 31 and 32 respectively may be formed in the extension of the gate sidewall spacer region. Conventional field oxide or other insulator 42 regions separate the source, drain and substrate contacts. It will also be understood by those having skill in the art that although the outer surface 41a of gate sidewall spacer 41 is illustrated as being curved in cross section, other shapes may be used, such as a linear outer surface to produce a triangular cross section or orthogonal outer surfaces to produce a rectangular cross section.

Low Leakage Current Fermi-Threshold Field Effect Transistor

Figure 2A:
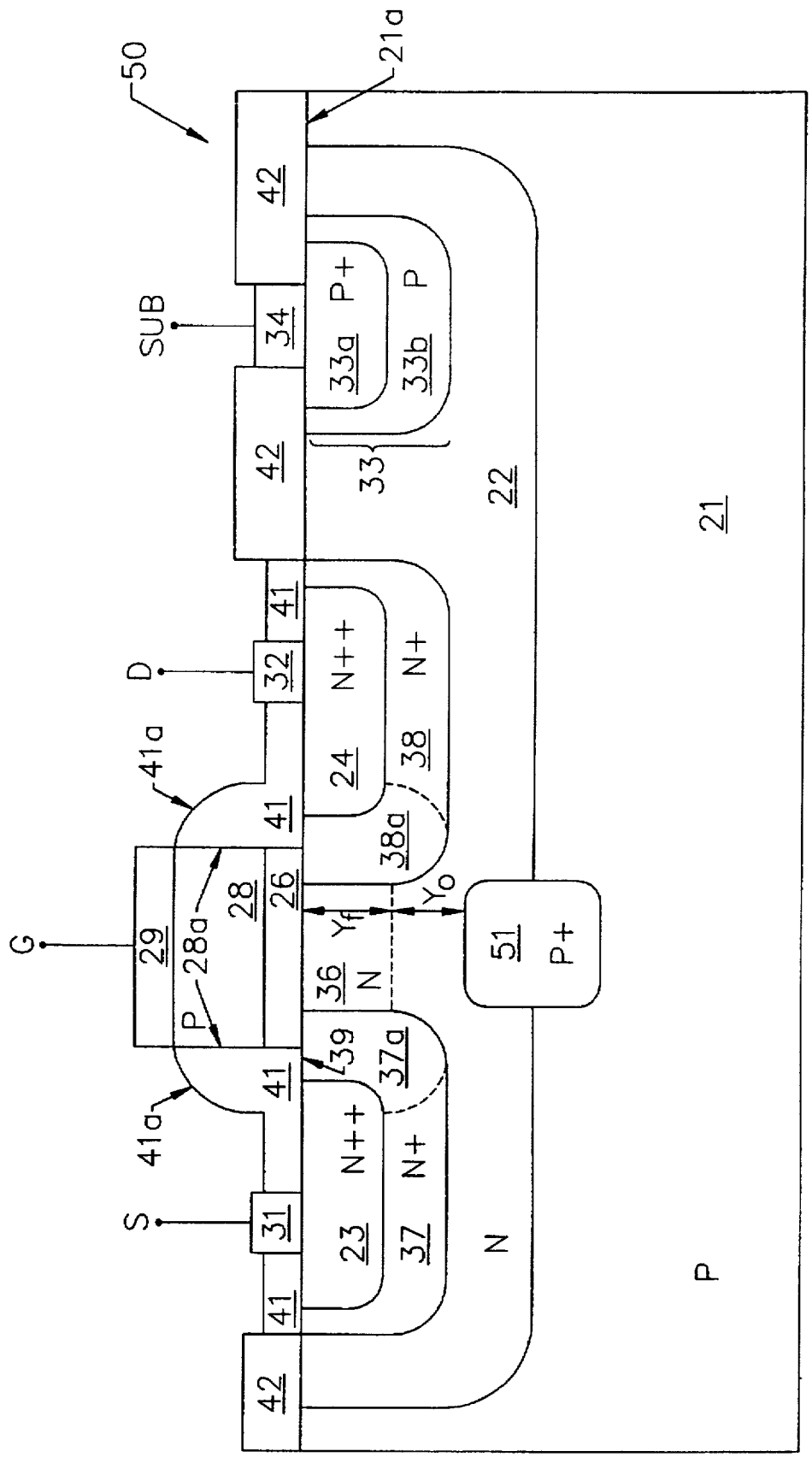
FIG. 2A illustrates a cross-sectional view of a first embodiment of a short channel low leakage current Fermi-FET according to U.S. Pat. No. 5,374,836.
Figure 2B:
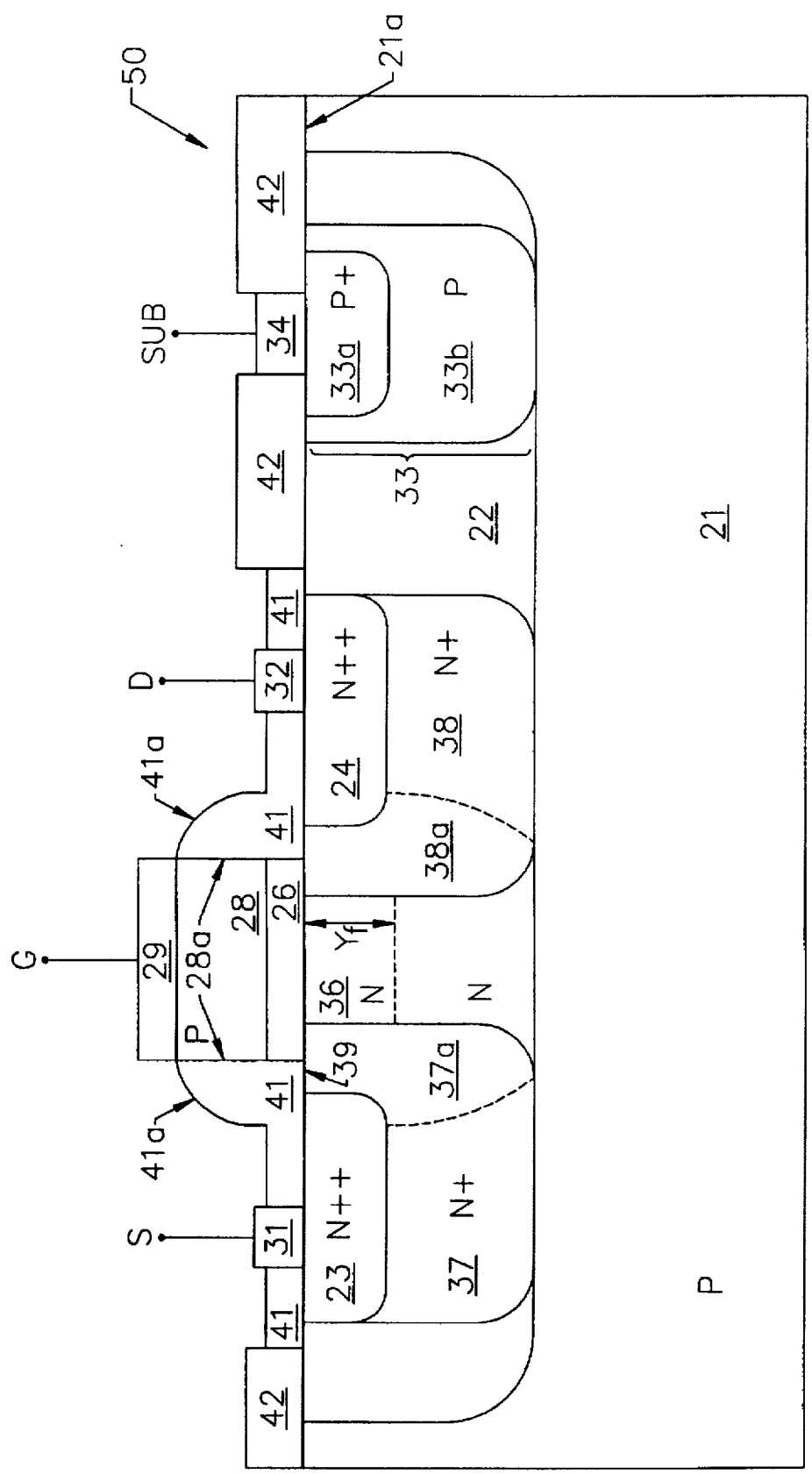
FIG. 2B illustrates a cross-sectional view of a second embodiment of a short channel low leakage current Fermi-FET according to U.S. Pat. No. 5,374,836.

Referring now to FIGS. 2A and 2B, Fermi-FETs which have short channels yet produce low leakage current, according to U.S. Pat. No. 5,374,836 will now be described. These devices will hereinafter be referred to as "low leakage current Fermi-FETs". The low leakage current Fermi-FET 50 of FIG. 2A includes a bottom leakage current control region 51 of first conductivity type, here P conductivity type, and doped at a high concentration relative to the substrate 21. Accordingly, it is designated as $P^+$ in FIG. 2A. The low leakage current Fermi-FET 60 of FIG. 2B includes extended source and drain injector regions 37a, 38a, which preferably extend to the depth of the Fermi-tub 22.

Referring now to FIG. 2A, bottom leakage current control region 51 extends across the substrate 21 from between an extension of the facing ends of the source and drain regions 23 and 24, and extends into the substrate from above the depth of the Fermi-tub 22 to below the depth of the Fermi-tub. Preferably, it is located below, and in alignment with the Fermi-channel 36. For consistency with the equations previously described, the depth from the Fermi-channel 36 to the top of the bottom current leakage current control region 51 has been labeled $Y_0$. The remainder of the Fermi-FET transistor of FIG. 2A is identical with that described in FIG. 1, except that a shorter channel is illustrated. It will be understood by those having skill in the art that injector regions 37a and 38a and/or injector tubs 37 and 38 may be omitted, as may the gate sidewall spacer region 41, to provide a low leakage current low capacitance, short channel Fermi-FET without the high current properties of the device of FIG. 2A.

The bottom leakage current control region 51 minimizes drain induced injection in short channel Fermi field effect transistors, i.e. those field effect transistors having a channel length of approximately 0.5 µm or less, while maintaining low diffusion depletion capacitance. For example, at 5 volts, leakage current of 3E–13A or less may be maintained.

The bottom leakage current control region may be designed using Equations (2) and (3) where $Y_0$ is the depth from the channel to the top of the bottom leakage control region as shown in FIGS. 2A and 2B. Factor α is the ratio between the $P^+$ doping of the bottom leakage current control region 51 and the N doping of the Fermi-tub 22. Preferably α is set to about 0.15 within the bottom leakage control region, i.e. below the gate 28. Below the source and drain regions 23 and 24, α is set to about 1.0 to minimize diffusion depletion capacitance. In other words, the doping concentrations of substrate 21 and Fermi-tub 22 are about equal in the regions below the source and drain. Accordingly, for the design parameters described above, and for a channel width of 0.5 micron, the doping concentration in the bottom leakage control region 51 is approximately 5E17 and is deep enough to support partial depletion at the tub-junction region given 5 volt drain or source diffusion potential.

Referring now to FIG. 2B, an alternate design for bottom leakage control extends the depth of source injector region 37a and drain injector region 38a, preferably to the depth of the Fermi-tub $(Y_f + Y_0)$. As shown in FIG. 2B, the depth of the entire source injector tub 37 and drain injector tub 38 may be extended, preferably to the depth of the Fermi-tub. The separation distance between the bottom of the injector tubs 37 and 38 and the bottom of the Fermi-tub 22 is preferably less than half the channel length and preferably approaches zero. Under these conditions, injector tubs 37 and 38 have doping concentration of about $1.5E18/cm^3$. The depth of substrate contact region 33b also preferably is extended to approach the Fermi-tub depth. The remainder of the Fermi-FET transistor 60 of FIG. 2B is identical with that described in FIG. 1, except that a shorter channel is illustrated.

Contoured-Tub Fermi-Threshold Field Effect Transistor

Figure 3:
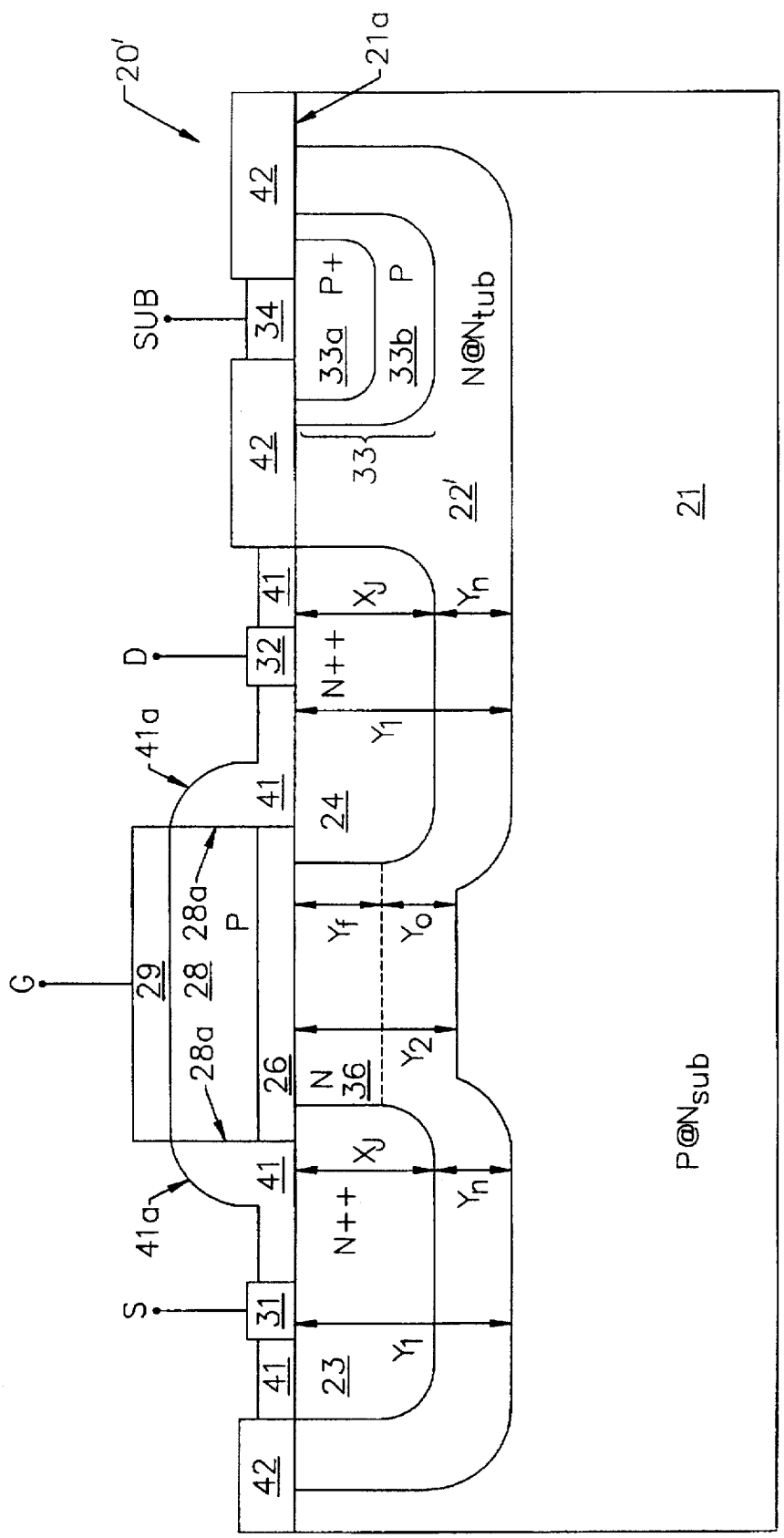
FIG. 3 illustrates a cross-sectional view of an N-channel contoured-tub Fermi-FET according to application Ser. No. 08/037,636.

Referring now to FIG. 3, an N-channel contoured-tub Fermi-FET according to application Ser. No. 08/037,636 is illustrated. It will be understood by those having skill in the art that a P-channel Fermi-FET may be obtained by reversing the conductivities of the N and P regions. As illustrated in FIG. 3, contoured-tub Fermi-FET 20' is similar to high current Fermi-FET 20 of FIG. 1, except that a contoured-tub 22' is present rather than the tub 22 of FIG. 1 which has a uniform tub depth. Injector tubs and injector regions are not shown, although they may be present.

Still referring to FIG. 3, contoured-tub 22' has a first predetermined depth $Y_1$ from the substrate face 21a to below at least one of the spaced-apart source and drain regions 23, 24 respectively. The contoured-tub 22' has a second predetermined depth $Y_2$ from the substrate face 21a to below the channel region 36. According to the invention, $Y_2$ is different from, and preferably less than, $Y_1$ so as to create a contoured-tub 22'. Stated another way, the junction between tub 22' and substrate 21 is pushed downward, away from source and drain regions 23 and 24, relative to the position dictated by the tub-FET criteria under the channel, to reduce the source/drain diffusion capacitance and thereby allow the contoured-tub Fermi-FET to operate at low voltages. It will be understood by those having skill in the art that tub 22' may only be contoured under source region 23 or drain region 24 to produce an asymmetric device. However, symmetric devices in which the tub is contoured under source 23 and drain 24 are preferably formed.

The second predetermined depth $Y_2$ is selected based on the low capacitance Fermi-FET (Tub-FET) criteria of U.S. Pat. Nos. 5,194,923 and 5,369,295. These criteria, which determine the depths $Y_f$ and $Y_0$, and which together form the second predetermined depth $Y_2$, are described above.

The first predetermined depth $(Y_1)$ is selected to be greater than the second predetermined depth $Y_2$. Preferably, the first predetermined depth is also selected to deplete the tub region 22' between the first predetermined depth $Y_1$ and the source and/or drain regions when zero voltage is applied to the source contact 31 and drain contact 32 respectively. Thus, the entire region labelled $Y_n$ is preferably totally depleted under zero source bias or drain bias respectively. Based on this criteria, $Y_1$ is determined by:

$$Y_n = \sqrt{\frac{kT}{q} Ln\left(\frac{N_{sub}N_{tub}}{n_i^2}\right) \frac{2\epsilon_s}{qN_{sub}} \frac{1}{\left(1+\frac{N_{sub}}{N_{tub}}\right)}} \quad (4)$$

where $N_{sub}$ is the doping concentration of the substrate 21 and $N_{tub}$ is the doping concentration of the contoured-tub 22'.

Short Channel Fermi-FETs

Figure 4:
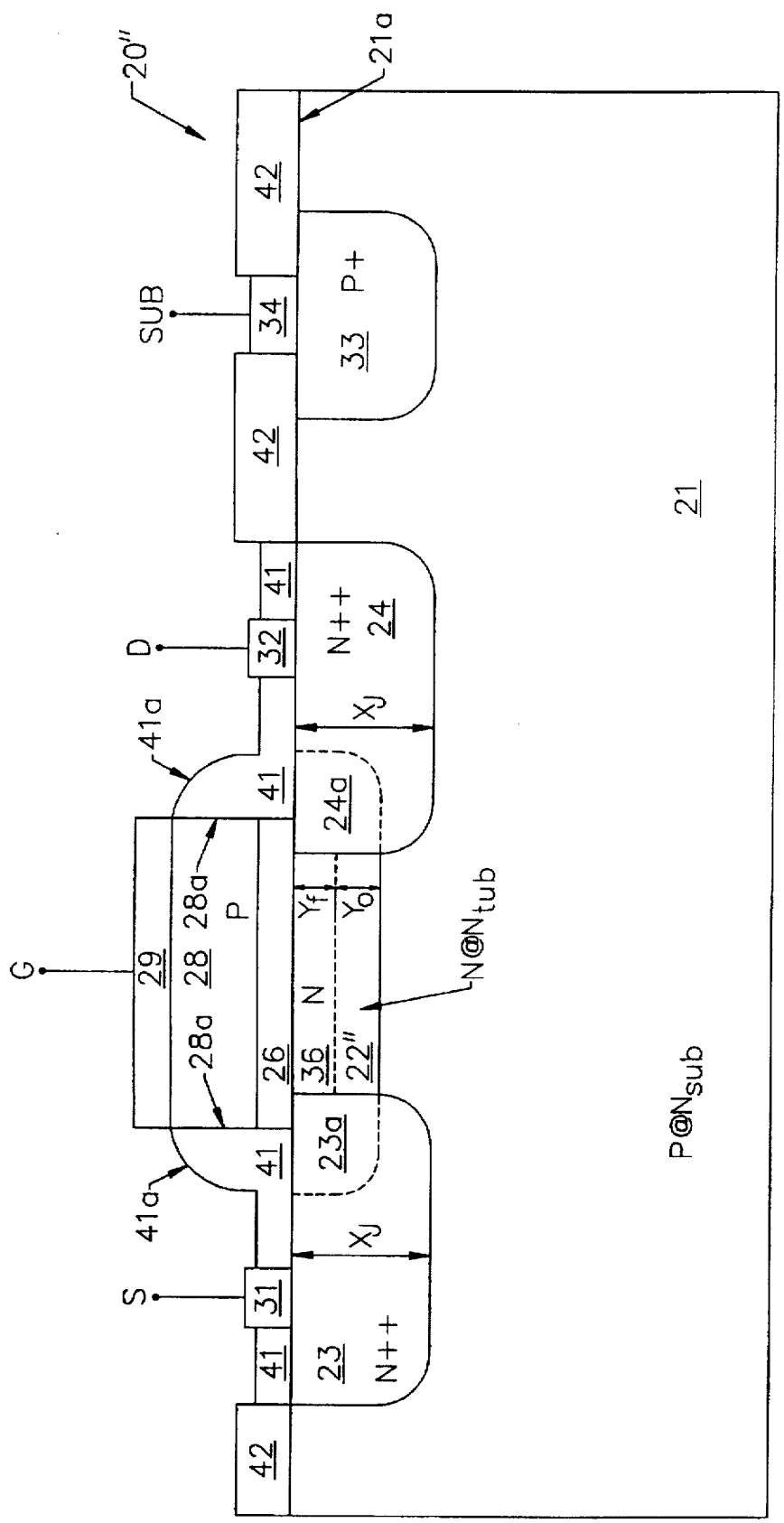
FIG. 4 illustrates a cross-sectional view of an N-channel short channel Fermi-FET according to application Ser. No. 08/505,085.

Referring now to FIG. 4, a short channel N-channel Fermi-FET 20" according to application Ser. No. 08/505,085 is illustrated. It will be understood by those having skill in the art that a P-channel short channel Fermi-FET may be obtained by reversing the conductivities of the N and P regions. As shown in FIG. 4, Fermi-tub 22" extends a first depth $(Y_f+Y_0)$ from the substrate surface 21a. The spaced-apart source and drain regions 23 and 24 respectively are located in the tub region, as shown by regions 23a and 24a. However, the source and drain regions 23 and 24 respectively also extend from the substrate surface 21a to beyond the tub depth. Source and drain regions 23 and 24 also extend laterally in a direction along substrate surface 21a, to beyond the tub region.

The channel depth $Y_f$ and the tub depth from the channel $Y_0$ are selected to minimize the static electric field perpendicular to the substrate surface in the channel 36 from the substrate surface to the depth $Y_f$ when the gate electrode is at threshold potential. As already described, these depths are also preferably selected to produce a threshold voltage for the field effect transistor which is twice the Fermi potential of the semiconductor substrate 21. These depths are also selected to allow carriers of the second conductivity type to flow from the source region to the drain region in the channel region, extending from the depth $Y_f$ toward the substrate surface 21a upon application of voltage to the gate electrode beyond the threshold voltage of the field effect transistor. Carriers flow within the channel region from the source region to the drain region underneath the substrate surface without creating an inversion layer in the channel. Accordingly, while not optimum, the device of FIG. 4 can still produce saturation currents far higher than traditional MOSFET transistors, with significant reductions in off-state gate capacitance. Drain capacitance becomes similar to standard MOSFET devices.

It will be understood that in FIG. 4, the source and drain regions extend beyond the tub region in the depth direction orthogonal to substrate face 21a, and also in the lateral direction parallel to substrate face 21a. However, in order to decrease the parasitic sidewall capacitance, the tub 22" preferably extends laterally beyond the source and drain regions, so that the source and drain regions only project through the tub in the depth direction.

Figure 5:
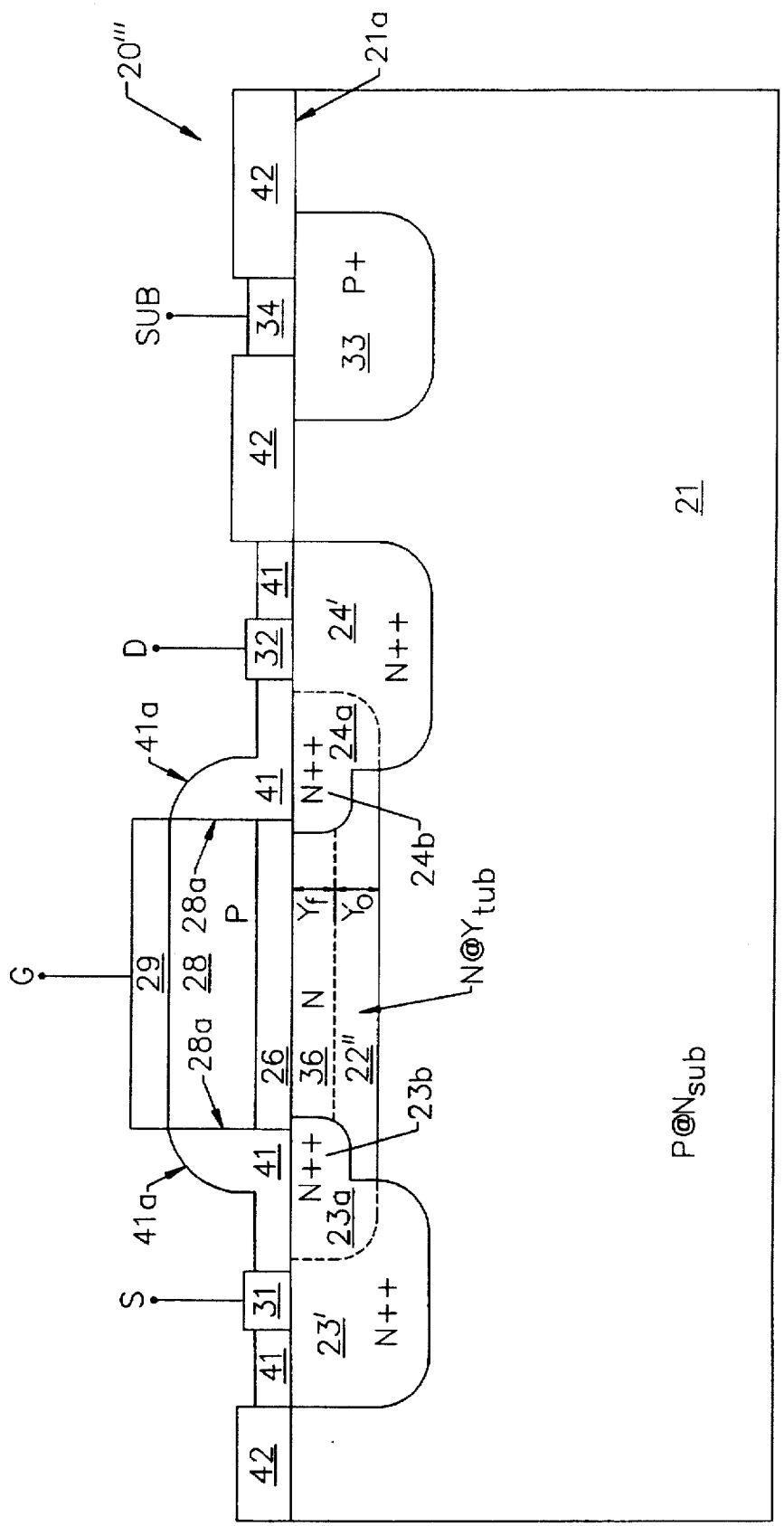
FIG. 5 illustrates a cross-sectional view of a second embodiment of an N-channel short channel Fermi-FET according to application Ser. No. 08/505,085.

Referring now to FIG. 5, a second embodiment of a short channel Fermi-FET according to application Ser. No. 08/505,085 the present invention is illustrated. Transistor 20'" is similar to transistor 20" of FIG. 4 except that source and drain extension regions 23b and 24b respectively are provided in the substrate 21 at the substrate face 21a adjacent the source region and drain regions 23' and 24' respectively, extending into channel 36.

As shown in FIG. 5, source and drain extension regions 23b and 24b respectively are heavily doped ($N^{++}$), at approximately the same doping concentration as source and drain regions 23' and 24'. It will be understood that the extensions 23b and 24b are not lightly doped as are lightly doped drain structures of conventional MOSFET devices. Rather, they are doped at the same doping concentration as the source and drain region, and are preferably as highly doped as practical in order to reduce leakage and improve saturation current.

The source and drain extension regions 23b and 24b reduce drain voltage sensitivity due to the charge sharing described above. Unfortunately, the device of FIG. 5 will generally not display as low a capacitance as the fully enclosed source and drain regions of FIGS. 1 and 2. It will be understood by those having skill in the art that in order to preserve the dimensions of the source/drain extension regions 23b and 24b, a heavy, slow moving dopant such as arsenic or indium is preferably used for the source and drain extension regions rather than a lighter, faster moving element which is typically used for the source and drain regions themselves.

Short Channel Fermi-FET Including Drain Field Termination

The architecture of short channel Fermi-threshold field effect transistors including drain field termination regions, also referred to herein as Vinal-FETs, according to the present invention, will now be described. It will be understood by those having skill in the art that P-channel Vinal-FETs may be obtained by reversing the conductivity of the N- and P-regions.

Figure 6:
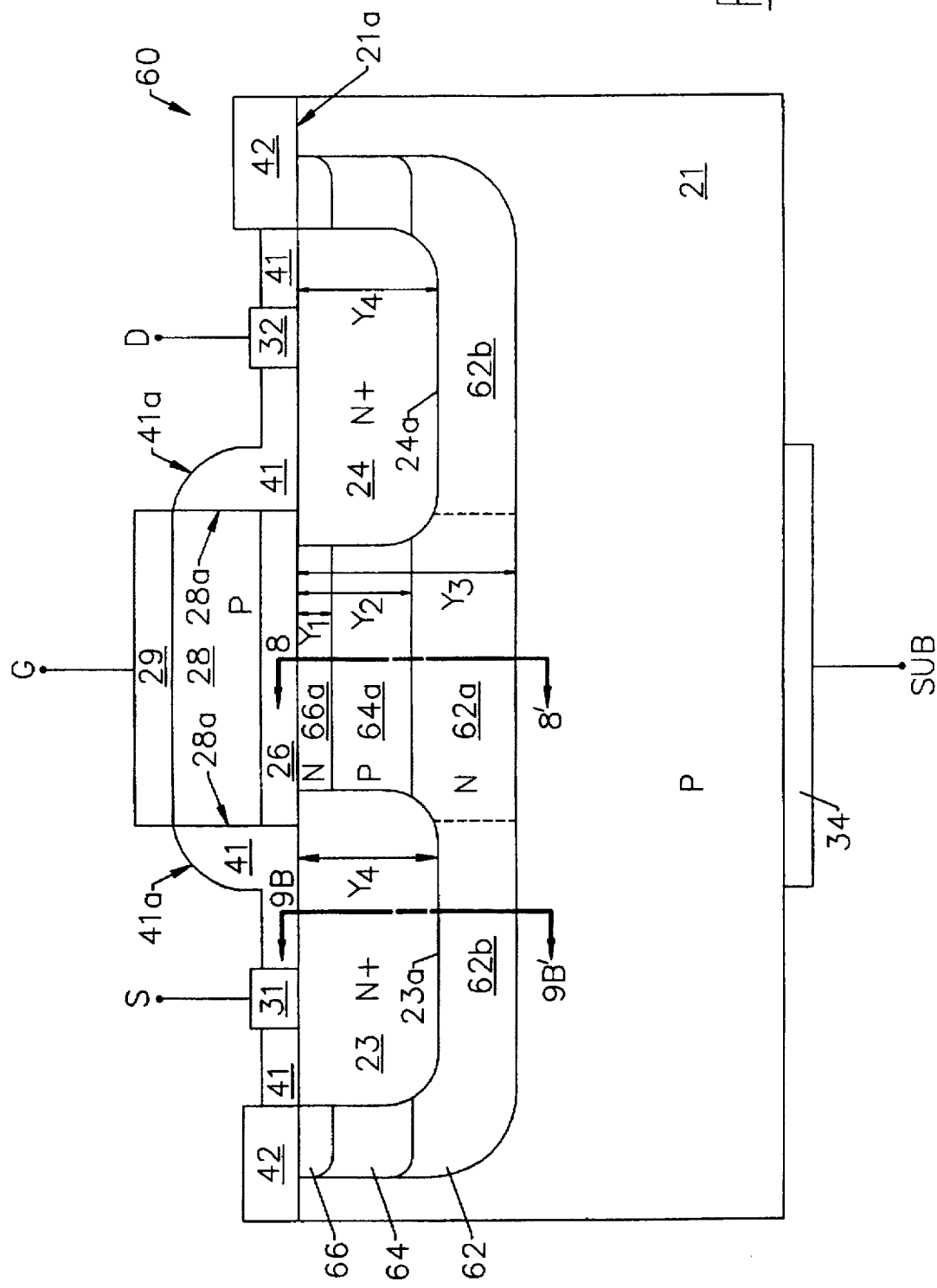
FIG. 6 illustrates a cross-sectional view of a first embodiment of a Vinal-FET according to the present invention.
Figure 7:
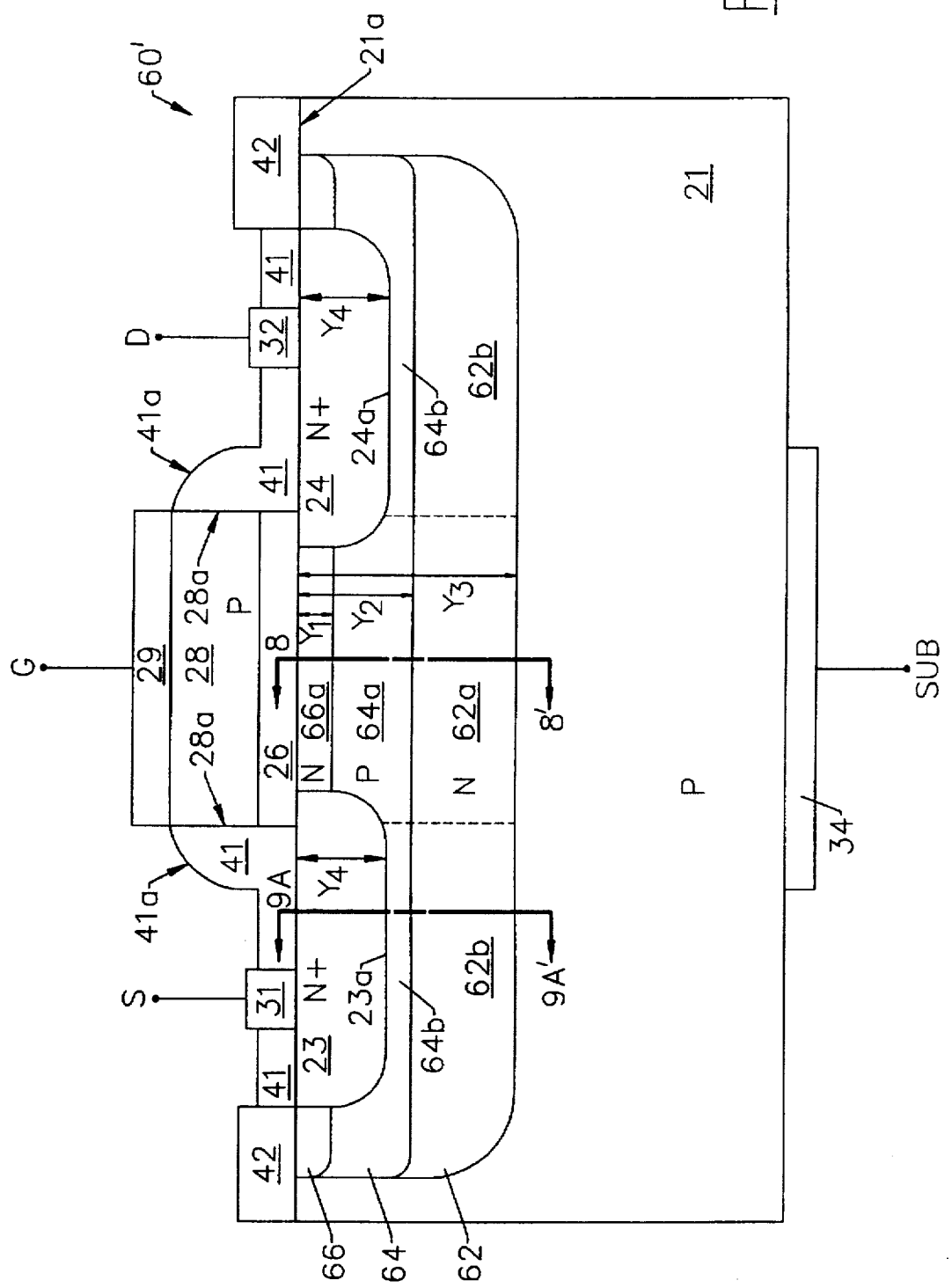
FIG. 7 illustrates a cross-sectional view of a second embodiment of a Vinal-FET according to the present invention.

FIGS. 6 and 7 illustrate first and second embodiments of a Vinal-FET respectively. As shown in FIG. 6, Vinal-FET 60 includes a semiconductor substrate 21 of first conductivity type, here P-type. It will be understood by those having skill in the art that semiconductor substrate 21 may also include one or more epitaxial layers formed on a bulk semiconductor material so that the substrate surface 21a may actually be the outer surface of an epitaxial layer rather than the outer surface of bulk semiconductor material.

Still referring to FIG. 6, a first tub region 62 of second conductivity type (here N-type) is formed on the substrate 21 at surface 21a and extending into the substrate a first depth $Y_3$ from the substrate surface 21a. A second tub region 64 of the first conductivity type, here P-type, is included in the first tub region 62. Second tub region 64 extends into the substrate a second depth $Y_2$ from substrate surface 21a, with the second depth $Y_2$ being less than a first depth $Y_3$. The second tub region 64 in the first tub region 62 may also extend laterally beyond first tub region 62. Second tub region 64 forms a Drain Field Terminating (DFT) region as will be described below. A third tub region 66 of the second conductivity type, here N-type, is included in the second tub region 64. The third tub 66 extends into the substrate 21 a third depth $Y_1$ from the substrate surface wherein the third depth $Y_1$ is less than the second depth. Third tub 66 is preferably formed in an epitaxial layer as will be described below.

Still referring to FIG. 6, spaced apart source and drain regions 23 and 24 respectively, of the second conductivity type (here N⁺), are formed in the first tub region 62 and extend into the substrate a fourth depth $Y_4$ from the substrate surface 21a. As shown in FIG. 6, the fourth depth $Y_4$ is greater than the third depth $Y_1$. As shown in FIG. 6, fourth depth $Y_4$ is also greater than the second depth $Y_2$, but is less than the first depth $Y_3$. Accordingly, the source and drain diffusions 23 and 24 respectively, extend through the third and second tubs 66 and 64 respectively, and into the first tub 62. In a second embodiment of a Vinal-FET 60' as shown in FIG. 7, the fourth depth $Y_4$ is greater than the third depth $Y_1$ but is less than the second depth $Y_2$, so that the source and drain regions extend through the third tub 66 and into the second tub 64, but do not extend into the first tub 62.

Vinal-FET transistors 60 and 60' of FIGS. 6 and 7 respectively, also include a gate insulating layer 26 and a gate electrode including polycrystalline silicon layer 28 of the first conductivity type, here P-type. Source, gate and drain contacts 31, 29 and 32 are also included as already described. A substrate contact 34 is also included. The substrate contact is shown opposite surface 21a but it may also be formed adjacent surface 21a as in previous embodiments.

The Vinal-FETs 60 and 60' of FIGS. 6 and 7 may also be described from the perspective of the layers in the substrate 21 which extend between the source and drain regions 24. When viewed in this regard, third tub 66 produces a first layer 66a of a second conductivity type in the substrate at the substrate surface which extends from the source region 23 to the drain region 24 and also extends into the substrate a first depth $Y_1$ from the substrate surface. Second tub 64 produces a second layer 64a of the first conductivity type in the substrate which extends from the source region 23 to the drain region 24 and extends into the substrate from the first depth $Y_1$ to a second depth $Y_2$ from the substrate surface. Second layer 64a acts as Drain Field Terminating means as described below. First tub 62 produces a third layer 62a of the second conductivity type in the substrate which extends from the source region to the drain region and extends into the substrate from the second depth $Y_2$ to a third depth $Y_3$ from the substrate surface.

When viewed in this manner, in the embodiment of FIG. 6, the third layer 62a also extends from the source bottom 23a to the drain bottom 24a as indicated by regions 62b. In the embodiment of FIG. 7, the second and third layers 64a and 62a respectively, both extend from the source bottom 23a to the drain bottom 24a as shown at regions 64b and 62b respectively.

The Vinal-FET of FIGS. 6 and 7 may also be regarded as a Tub-FET which includes a counterdoped buried tub 64 within the original tub. Still alternatively, the Vinal-FET may be viewed as a Tub-FET which includes a buried layer of first conductivity type 64a beneath the channel region 66a. As will be described in detail below, second tub 64 including second layer 64a acts as Drain Field Terminating (DFT) means to shield the source region by preventing the applied drain bias from causing carriers to be injected from the source region into or below the channel region. Accordingly, second tub 64 and second layer 64a may also be referred to as a Drain Field Termination (DFT) region.

Operation of the Vinal-FET

Operation of the Vinal-FET transistors 60 and 60' of FIGS. 6 and 7 will now be described. The Vinal-FET prevents excessive Drain induced Barrier Lowering (DIBL), while still allowing low vertical field in the channel, similar to a Fermi-FET. In addition, the Vinal-FET permits much higher carrier mobility, and also may reduce source and drain junction capacitance. A Vinal-FET may be visualized as a very thin, very low alpha value Fermi-FET transistor which also allows reasonable source and drain depths without parasitic high capacitance.

Vinal-FET devices include a Drain Field Termination (DFT) region in the form of second tub 64 or second layer 64a. The DFT region acts as a shield for the source region 23 (particularly for the structure of FIG. 7), reducing and preferably preventing carrier injection from the source region into or below the channel region, corresponding to first layer 66a, as a result of applied bias to drain contact 32.

The first tub 62 defines the bottom edge of the DFT region (depth $Y_2$) and helps to moderate the effect of the extra dopant in the DFT region that might otherwise cause increased device threshold. The first tub 62 may also significantly lower the capacitance associated with the source and drain regions. This capacitance is present in both the source and drain regions of the transistor 60 of FIG. 6. In transistors 60' of FIG. 7, the initial (zero applied voltage) source capacitance is set by the source:DFT region (23:64b) junction, but as the source potential increases, the remaining DFT dopant atoms are depleted in the region below the source region causing a rapid drop in the junction capacitance.

Drain induced carrier injection has caused short channel Fermi-FET devices to depart from the ideal condition as channels become shorter. As already described, in order to reduce unwanted leakage in a Fermi-FET, the tub region was thinned and/or the substrate doping level was increased, which may also raise the transistor's threshold.

Continued miniaturization below one-half micron in channel length led to the need for lower operating voltages, but the smaller separation between the source and drain regions still generally increased the strength of the drain field at the source diffusion. The lower operating voltages reduced the available overhead for threshold voltage, which may cause even short channel Fermi-FETs to begin to suffer performance loss due either to high threshold or high leakage.

In contrast, Vinal-FETs of the present invention provide a low vertical field, low threshold Fermi-FET type region created from the first layer 66a and the second (DFT) region 64a between the source and drain regions. The DFT region is deep enough to reduce and preferably prevent leakage between the source and drain diffusions. The DFT region is preferably constructed such that the region between the source and drain regions is not fully depleted under normal operating conditions. The undepleted dopant atoms act as drain field termination sites, reducing and preferably preventing the drain field from reaching the source electrode.

Figure 8:
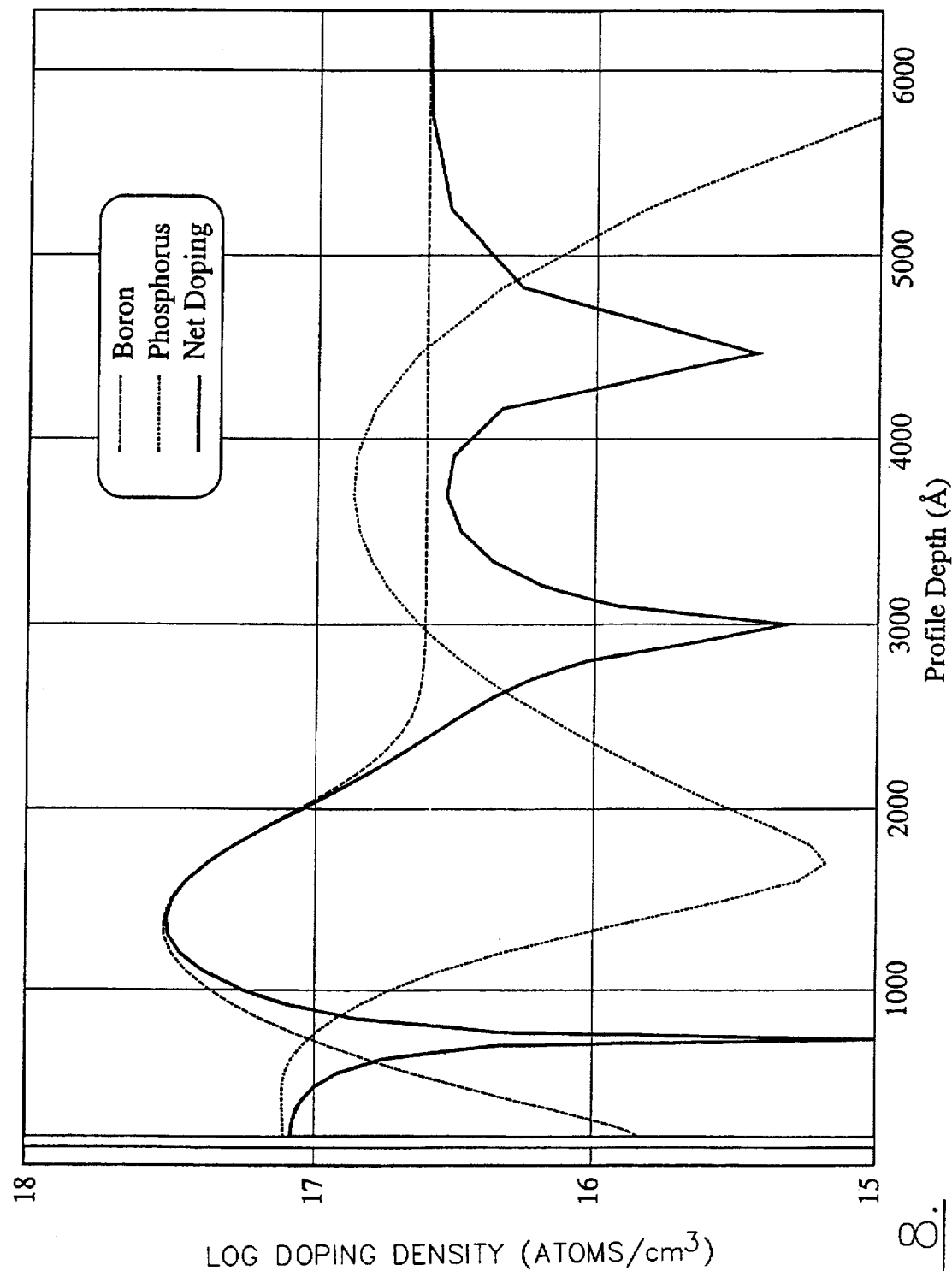
FIG. 8 graphically illustrates a net doping profile for the Vinal-FETs of FIGS. 6 and 7 along the line 8–8'.
Figure 9B:
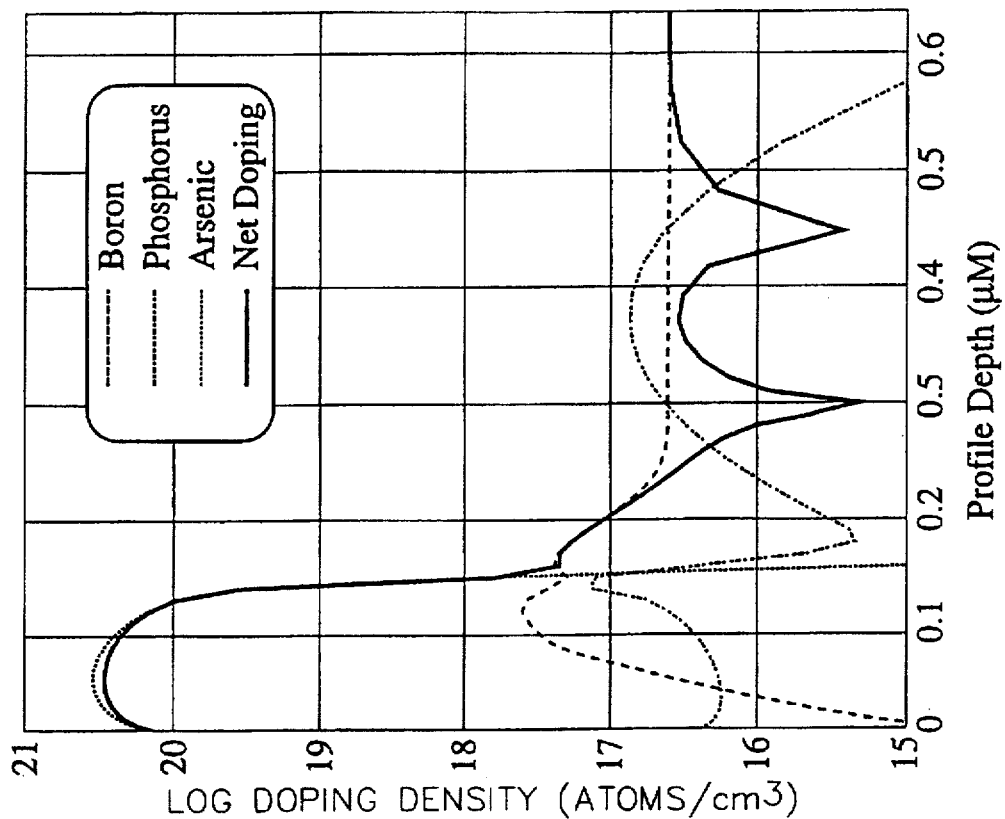
FIGS. 9A and 9B graphically illustrate the net doping profile along the lines 9A–9A' and 9B–9B' of FIGS. 7 and 6 respectively.
Figure 9A:
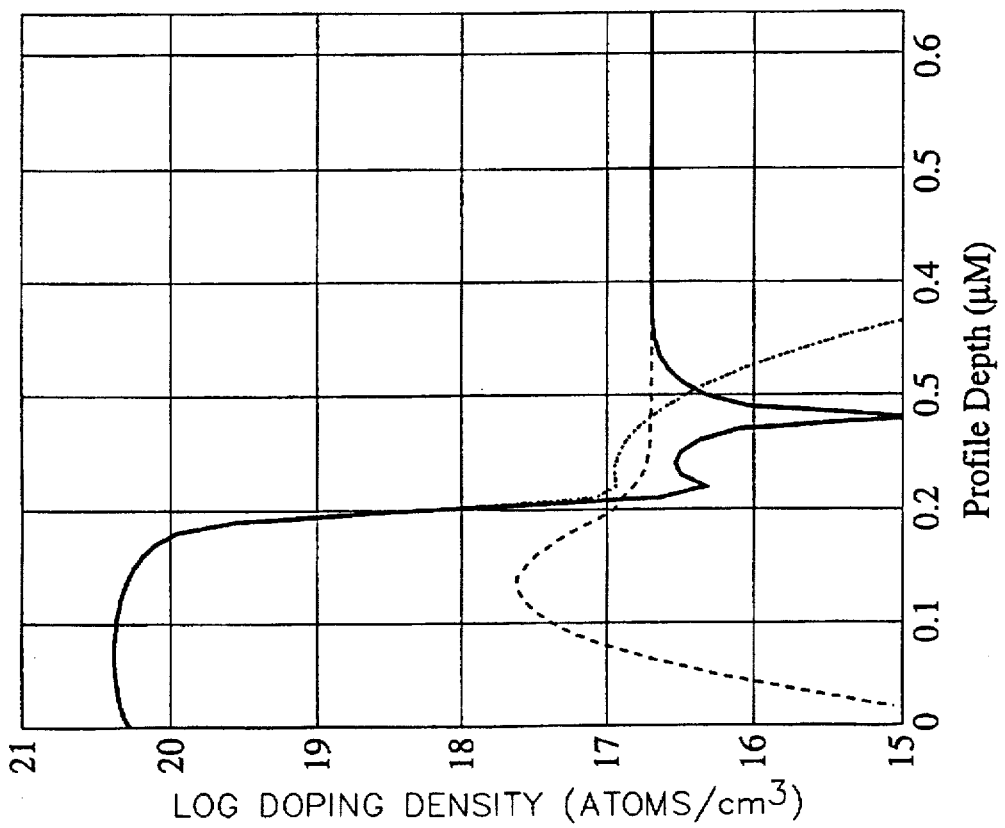

FIG. 8 graphically illustrates a net doping profile for the Vinal-FETs of FIGS. 6 and 7 along the line 8–8' normal to the substrate surface 21a between the source and drain. FIG. 8 also graphically illustrates the distribution of the individual dopant elements (Boron and Phosphorous) which can be used to create the net doping profile. FIGS. 9A and 9B graphically illustrate the net doping profile normal to the substrate surface along the lines 9A–9A' and 9B–9B' respectively, within the source or drain region. FIG. 9A graphically illustrates the net doping profile for the Vinal-FET 60 of FIG. 7 and FIG. 9B illustrates the net doping profile of the Vinal-FET 60' of FIG. 6.

It can be shown that for extremely short devices, a thin third tub 62 allows lower leakage and/or lower threshold. Therefore, initial Vinal-FET devices were simulated using 0.25 μm drawn channel length, 60 Å gate oxides and maximum drain voltages of 2.5 Volts.

Figure 10:
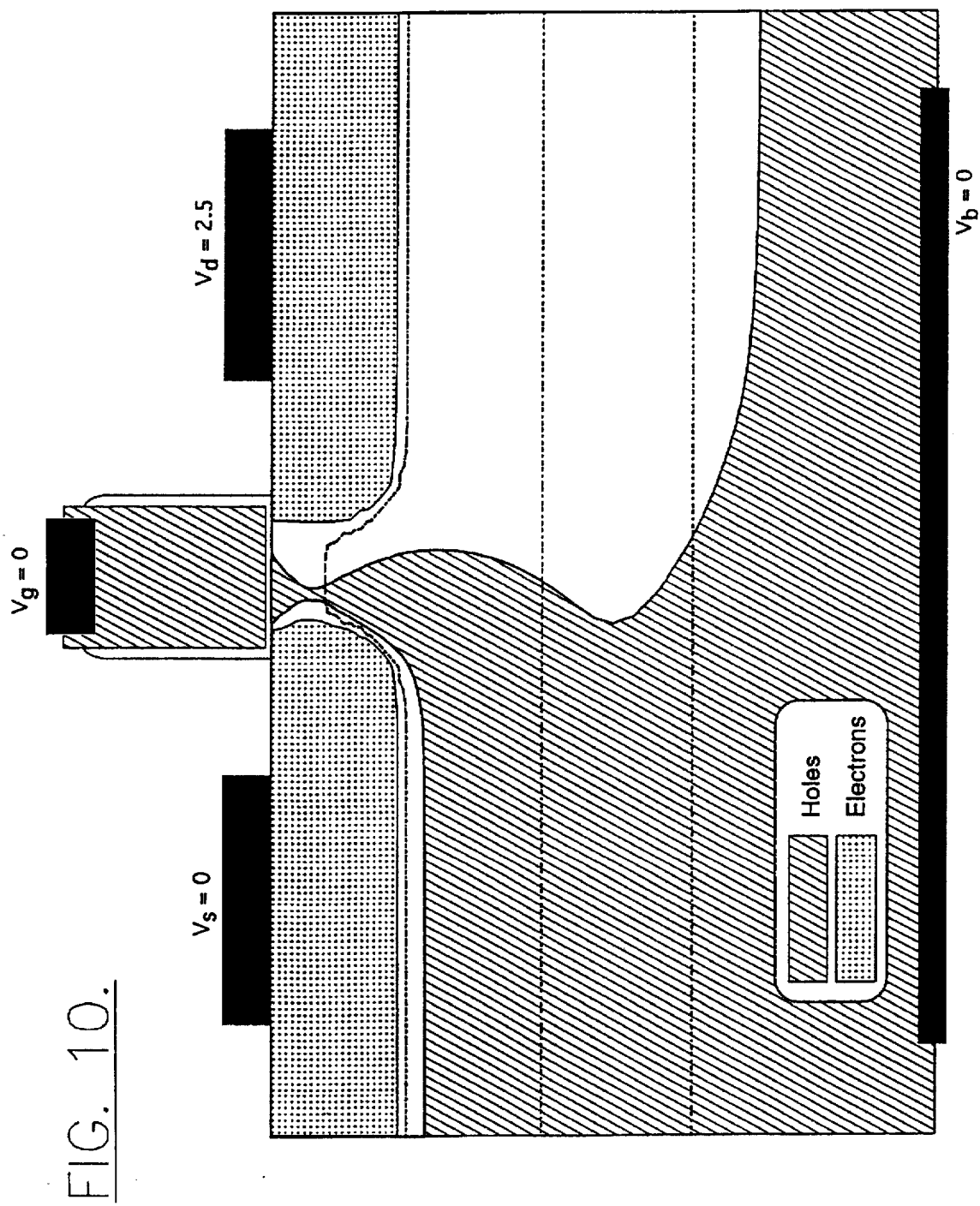
FIGS. 10, 11 and 12 illustrate simulation results for the Vinal-FET of FIG. 7.

FIG. 10 illustrates a cross-section of a Vinal-FET from a PISCES2 simulation. FIG. 10 illustrates areas of the substrate which are depleted of mobile carriers. Electrons and holes greater than $1 \times 10^{10}/cm^3$ are shown. The location of the contacts are also shown. The conditions for the simulation are $V_s=V_b=V_g=0$ Volts and $V_d=2.5$ Volts where $V_s$, $V_b$, $V_g$ and $V_d$ are the source, substrate, gate and drain voltages respectively.

FIG. 10 shows the undepleted silicon for an N-Channel the Vinal-FET of FIG. 7. The Vinal-FET 60' of FIG. 7 has the potential for lowered leakage at a given linewidth and threshold voltage compared to the Vinal-FET 60 of FIG. 6. A penalty for this improved performance may be slightly higher drain capacitance due to the source:DFT junction which has a much thinner depletion region than in a device according to FIG. 6. In FIG. 10, the source electrode is on the left-hand side. The source, gate, and substrate electrodes are at zero volts; the drain electrode is at 2.5 volts. The transistor is in the "off" state. The hatched areas in the cross-section drawing correspond to regions where the free hole concentration is greater than $1 \times 10^{10}$ holes/$cm^3$. The areas shaded with dots correspond to regions where the electron concentration is greater than $1 \times 10^{10}/cm^3$. Therefore, the regions with no shading are assumed to be fully depleted of mobile charges, i.e. the carrier concentrations are below the intrinsic level $ni \approx 1.45 \times 10^{10}/cm^3$. The P-N junctions are depicted as dashed lines. There are three in FIG. 10.

As shown in FIG. 10, even though the doping of the channel region matches that of the source and drain regions, the doping and spacing of the DFT structure is such that the area between the source and drain regions contains an excess of free holes. This supplies needed free carriers to act as field termination sites in the channel volume, greatly reducing the number of carriers injected from the source region which would produce elevated leakage. Also note the depleted region under the drain region. The first tub structure 62 greatly enhances the overall depletion width, significantly lowering junction capacitance.

Figure 11:
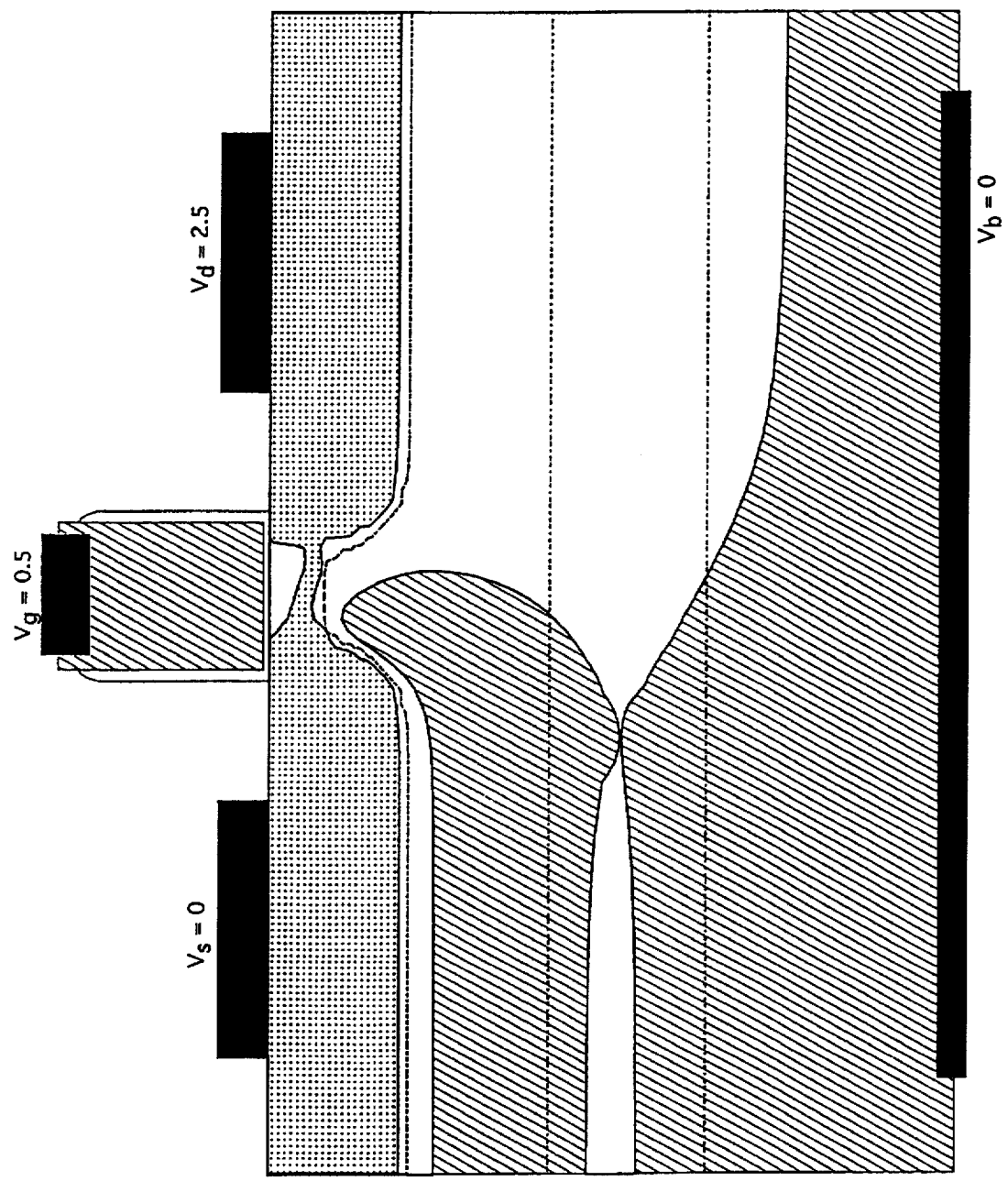
Figure 12:
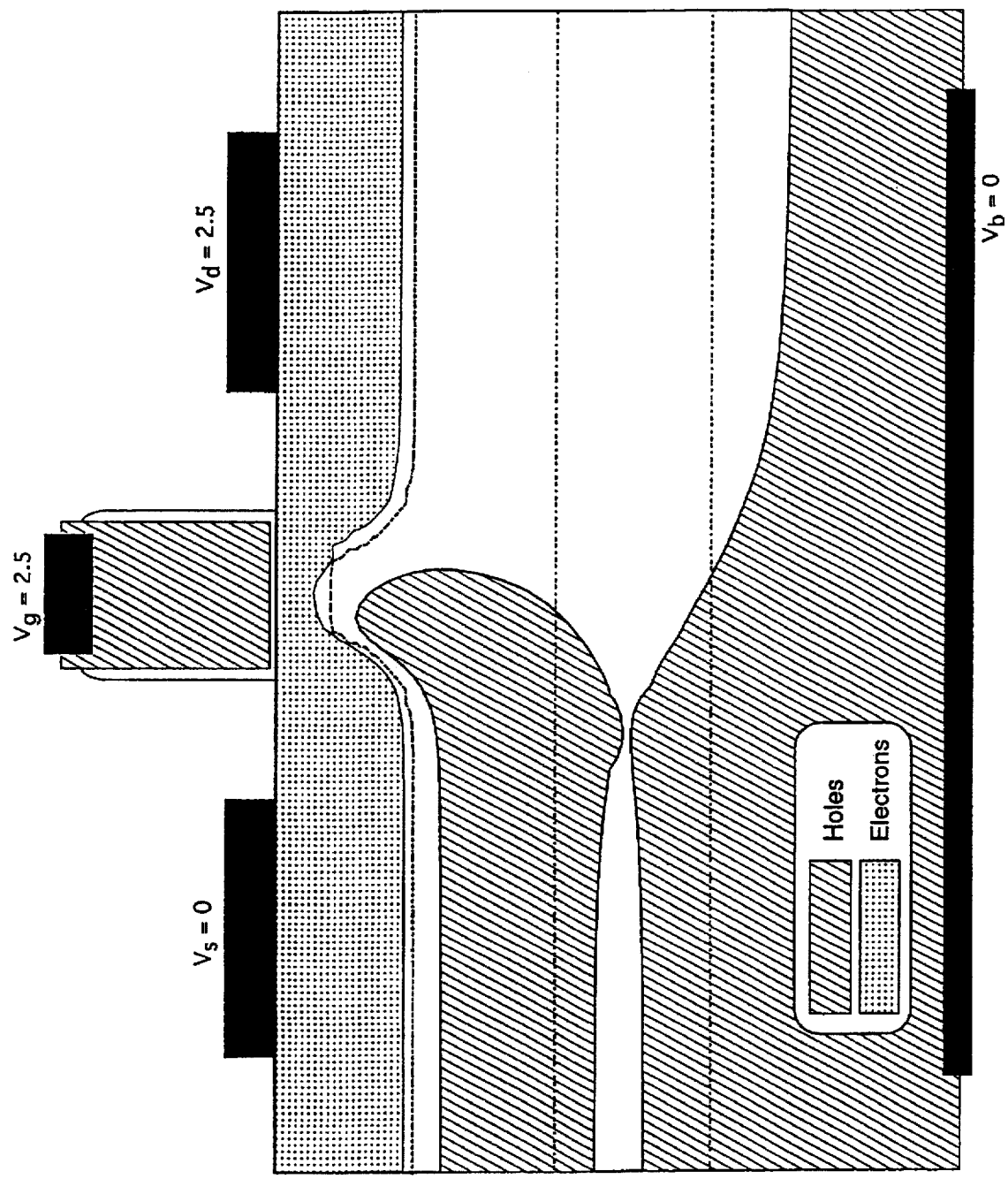

FIG. 11 is identical to FIG. 10 except that the bias on the gate electrode is approximately at the threshold potential (about 0.550 Volts). FIG. 11 illustrates electrons greater than $1 \times 10^{13}/cm^3$ and holes greater than $1 \times 10^{10}/cm^3$. Under these conditions, a channel region has just formed near the third-Tub:DFT junction. The shaded region in the third Tub between the source and drain diffusion depicts roughly neutral silicon. The carriers in this region are under the influence of the applied drain bias only. FIG. 12 is also similar to FIG. 9 except for the gate bias on the gate electrode which is set to $V_g=2.5$ Volts. Electrons greater than $1 \times 10^{15}/cm^3$ and holes greater than $1 \times 10^{10}/cm^3$ are shown. This figure depicts the transistor in saturation. The majority of the channel region contains an excess of carriers which have been injected from the source region. These conduction carriers are under the influence of both the applied drain bias and the portion of the gate bias above threshold ($V_g-V_t$).

The doping in the DFT region 64a preferably includes three terms. First, the DFT preferably supplies exactly enough minority charge to fully deplete the channel region 66a above it. This charge is:

$$N_{cdep} = \overline{N}_c Y_1 \tag{5}$$

Where $\overline{N}_c$ is the average doping in the channel region. $Y_1$ is the channel depth. There is another constraint however: There should preferably be sufficient charge to allow full depletion of the source and drain regions. Each region will deplete a volume of the DFT as:

$$W_{DFT} = \sqrt{\frac{2\epsilon_s N^+ \phi_b + V_a}{q N_{DFT}(N_{DFT}+N^+)}} \quad \text{where}$$

$$\phi_b = \frac{kT}{q} LN\left(\frac{N^+}{N_{DFT}}\right) \tag{6}$$

$N_{DFT}$ and $N^+$ are the doping of the DFT region 64a and the source and drain regions 23 and 24 respectively, and $V_a$ is the voltage applied to the diffusion (either source or drain) relative to the substrate. Assuming the charge required in Equation (5) can be shown to be small compared to what is required to satisfy the junction formed by the diffusion at maximum potential, an approximate minimum $N_{DFT}$ may be assumed as that concentration that would consume approximately 40% of the available width ($L_{eff}$).

Setting $W_{DFT}$ in Equation (6) to $0.4 \ast L_{eff}$ and setting $V_a$ to $V_d$, Equation (6) can be solved for $N_{DFT}$:

$$N_{DFT} = \frac{2\epsilon_s(\phi_b + V_d)}{q(0.4L_{eff})^2} \tag{7}$$

Equation (7) describes the preferred minimum requirement for the doping level of the DFT structure between the source and drain diffusions from the depth $Y_1$ to approximately 150% of $Y_1$. PISCES2 simulations have shown very low leakage devices when the depth corresponding to the maximum doping level of the DFT structure is at approximately $Y_2$. Source and drain capacitance preferably may be optimized by setting the profile of the bottom portion of the DFT structure (from depth $1.5Y_1$ to $Y_2$) and the density and width of the first tub structure such that the depletion under the source and drain diffusions fully depletes the remaining DFT charge and the additional diffusion potential begins to terminate on the substrate charge below the bottom tub at approximately 0.5 Volts.

Figure 13:
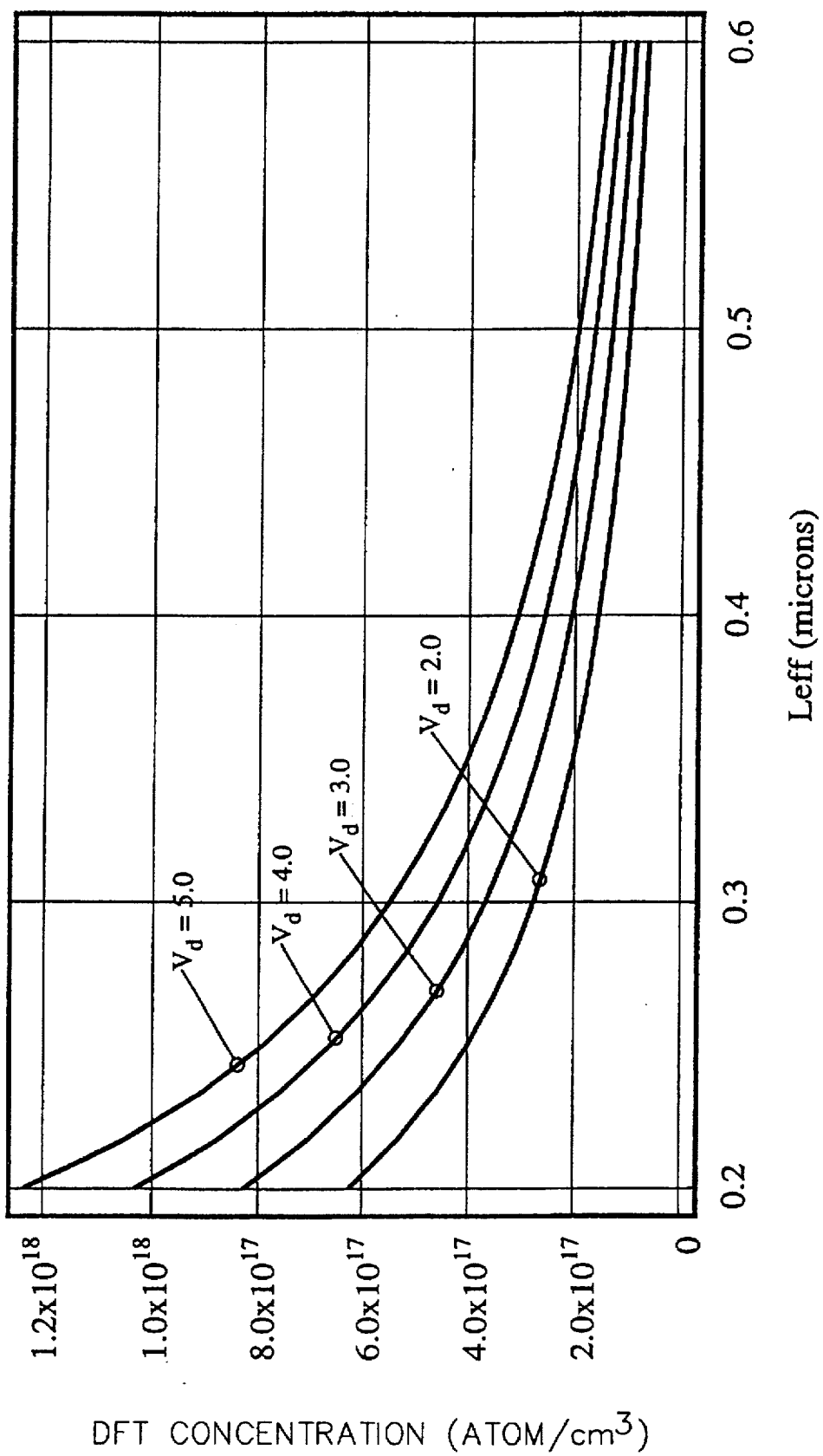
FIG. 13 graphically illustrates minimum preferred doping for the drain field termination region of the Vinal-FET of FIGS. 6 and 7.

FIG. 13 depicts preferred doping for the top part of the DFT structure per Equation (7). Channel lengths of 0.2 μm to 0.6μm with operating voltages of 2 to 5 volts are illustrated, and show good agreement with the results of SUPREM4 and PISCES2 simulations.

The first tub 62 extends from depth $Y_2$ to depth $Y_3$ and is similar to the third tub 66 in that it should be designed to be depleted by the DFT region. Increasing the width of the first tub 62 has a positive effect on junction capacitance, but it will now be shown that a maximum desirable depth is preferably reached. Wider first tubs 66 eventually move the lower junction sufficiently far from the bottoms 23a and 24a of the source and drain regions 23 and 24 respectively, such that the substrate 21 no longer falls within the depletion region produced by applied bias on the source and drain electrodes. Additionally, if the first tub concentration reaches a point where the depletion due to the substrate 21 and DFT region 64a no longer fully deplete all majority carriers in the first tub, the transistor may have high leakage levels, poor substrate coupling, and may be prone to latch-up.

Accordingly, a useful thickness target for the first tub 62, arrived at empirically, is approximately the same thickness as the second (DFT) layer 64a. This thickness allows more than complete depletion by the substrate and the lower edge of the DFT structure.

As can be seen in FIG. 10, the thickness and doping density of the first tub is preferably adjusted such that the sum of the depleted width due to the DFT:first tub junction:

$$W_{DFT:FT} = \sqrt{\frac{2kT\epsilon_s N_{DFT} Ln\left(\frac{N_{DFT}}{N_{FT}}\right)}{q^2 N_{FT}(N_{FT}+N_{DFT})}} \quad (8)$$

Figure 14:
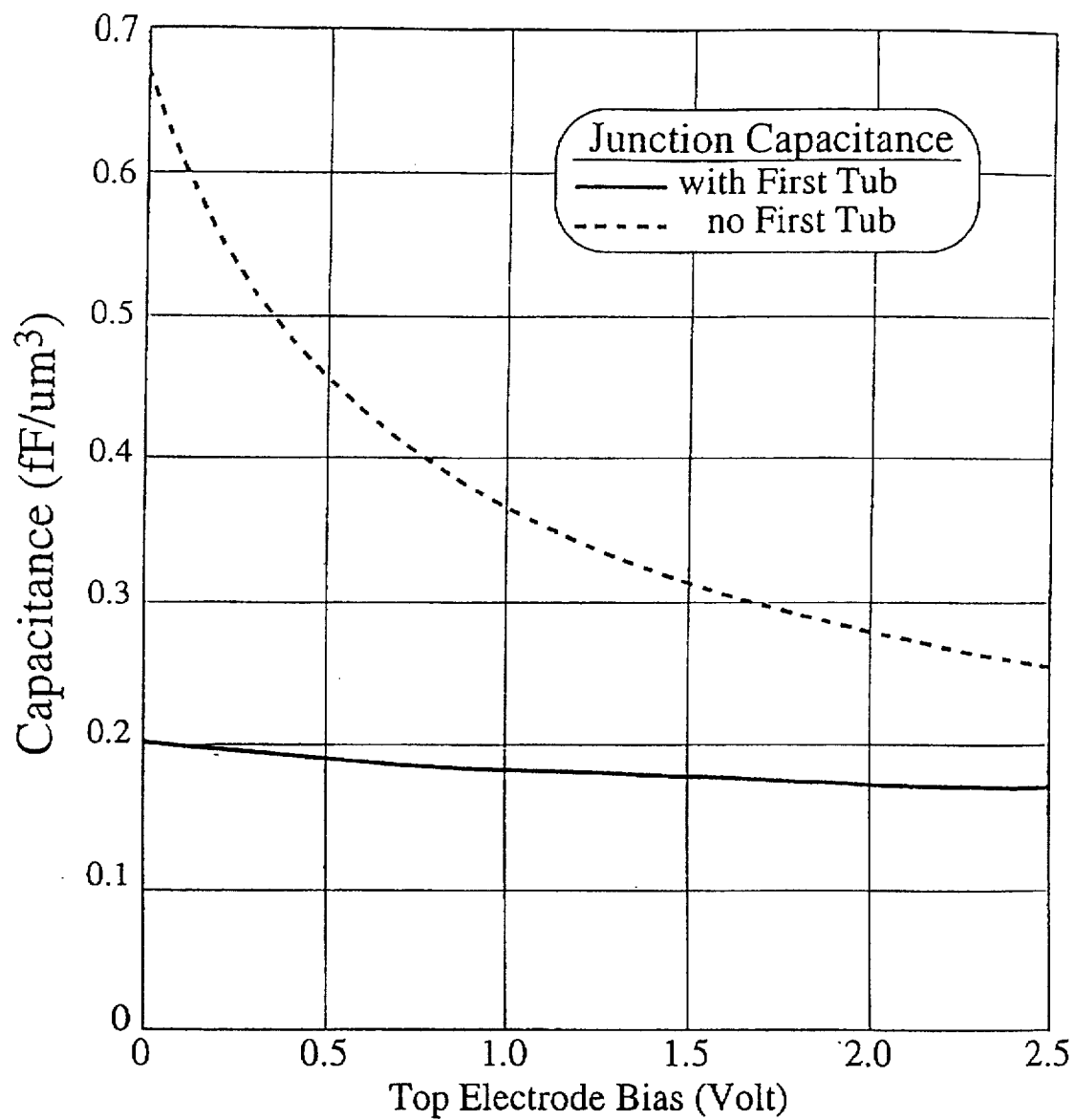
FIG. 14 graphically illustrates the capacitance of the source or drain region versus applied voltage.

(where $N_{DFT}$ and $N_{FT}$ represent the average doping density in the DFT layer 64a and the first tub 62 respectively) and the depleted width due to the first tub:substrate junction:

$$W_{Sub:FT} = \sqrt{\frac{2kT\epsilon_s N_{Sub} Ln\left(\frac{N_{Sub}}{N_{FT}}\right)}{q^2 N_{FT}(N_{FT}+N_{Sub})}} \quad (9)$$

is greater than the total first tub width. This causes the region that is chemically N-type (in the N-Channel version of the Vinal-FET) to be normally occupied by an excess of minority carriers (holes for the N-Channel variant). The region will behave electrically as if it were P-type causing a smooth capacitance curve as shown in FIG. 14. This avoids parasitic latch-up due to the extra junction in the tub region and improves the voltage drop of the source and drain diffusions.

It should be noted that although the junctions involved are abrupt, they are generally not "step" junctions. Therefore, the total depletion width is split at each junction according to:

$$N_a x_n = N_d x_p \quad (10)$$

where $N_a$ and $N_d$ are the acceptor and donor concentrations in the P-type and N-type sides of the junction. $x_p$ and $x_n$ are the widths of the depletion region on the P-type and N-type sides of the junction respectively. Setting the first tub width to 75% of the sum of the depleted widths produced by the DFT:first tub junction and the substrate:first tub junction on the first tub side of the junctions only according to Equation (10). Equations (8), (9) and (10) and the 75% thickness assumption can then be combined and reordered to define a maximum first tub width versus $N_{DFT}$, $N_{FT}$ and substrate doping level $N_{sub}$:

$$Y_3 - Y_2 = \frac{0.75}{N_{FT}} \times \left( \sqrt{\frac{4kT\epsilon_s(N_{DFT}+N_{FT})}{q^2 N_{DFT} N_F} Ln\left(\frac{N_{DFT}N_{FT}}{n_i^2}\right)} + \sqrt{\frac{4kT\epsilon_s(N_{Sub}+N_{FT})}{q^2 N_{Sub} N_{FT}} Ln\left(\frac{N_{Sub}N_{FT}}{n_i^2}\right)} \right) \quad (11)$$

It will be understood by those having skill in the art that Equation (11) preferably defines a starting point for analysis using a device simulator such as PISCES2 to adjust the thickness and doping levels of the first tub to achieve desired capacitance and leakage characteristics.

Vinal-FET Fabrication Processes

Referring now to FIGS. 15A–15E, a preferred process for forming Vinal-FET transistors 60 of FIG. 6 will be described. It will be understood that the Vinal-FET of FIG. 7 may be provided by reducing the implant depth of the source and drain regions. Complementary transistors may be formed by reversing conductivity types.

In general, the methods include the steps of forming in a semiconductor substrate of first conductivity type, a first tub of second conductivity type and a second tub of the first conductivity type in the first tub. A layer of second conductivity type is epitaxially formed (in situ doped or subsequently doped second conductivity type) on the semiconductor substrate adjacent the first and second tubs. Spaced apart source and drain regions of second conductivity type are then formed in the epitaxial layer and in the second tub. They may also extend into the first tub.

Figure 15A:
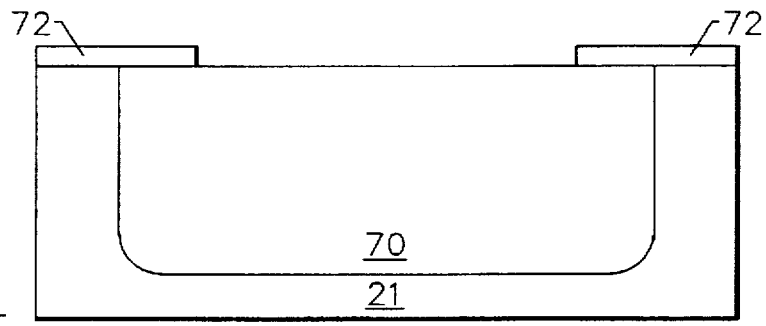
FIGS. 15A–15E illustrate cross-sectional views of the Vinal-FET transistor of FIG. 6 during intermediate fabrication steps.
Figure 15B:
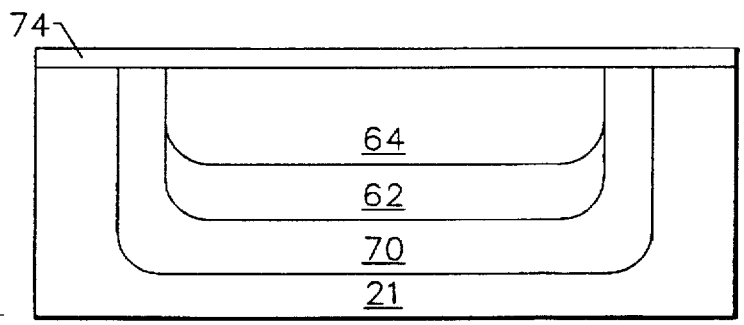

Referring now to FIG. 15A, a fabrication process begins with an N-type or P-type substrate and includes a conventional implant of a P-well 70 using mask 72. Referring to FIG. 15B, a conventional screen oxidation is performed to form screen oxide 74 and an ion implant of the first tub 62 and of the second (DFT) tub 64 within first tub 62 is performed. Conventional implants of ions of the first and second conductivity types are used. The second tub may be implanted before the first tub. An activation anneal is then performed.

Figure 15C:
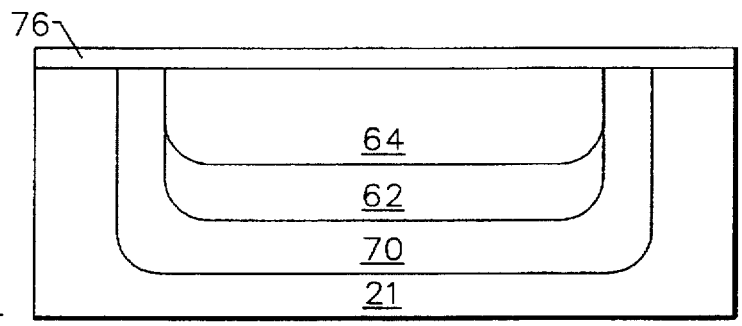
Figure 15D:
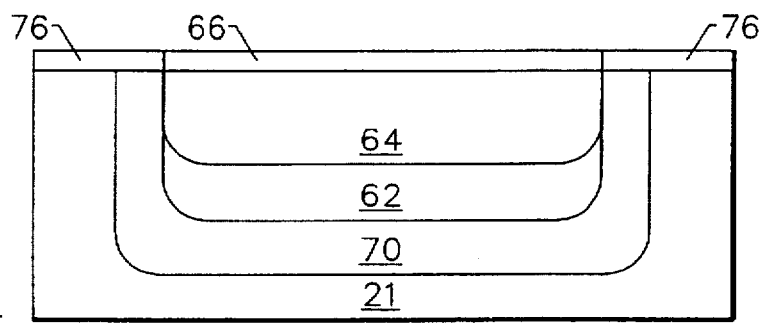

Referring now to FIG. 15C, screen oxide 74 is removed and an epitaxial deposition of epitaxial layer 76 is performed. Then, in FIG. 15D, third tub 66 is implanted into layer 76 using ions of second conductivity type. A masked or an unmasked implant may be used. It will also be understood that in situ doping of layer 76 may be used during epitaxial deposition to thereby simultaneously dope the epitaxial layer the second conductivity type while epitaxially depositing the second layer.

Figure 15E:
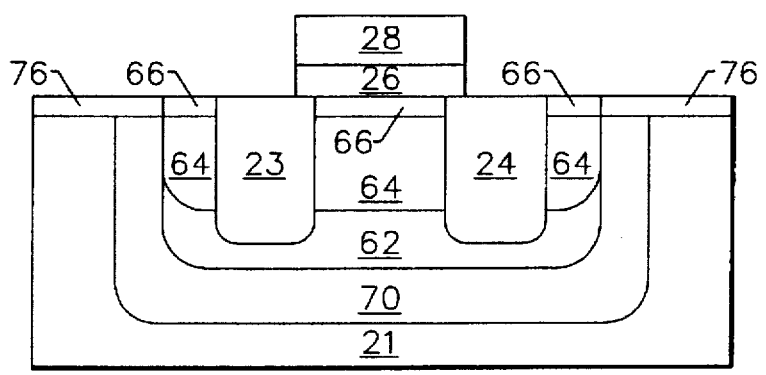

Then, in FIG. 15E, the gate oxide 26 is formed and the polysilicon gate 28 is formed and doped using conventional methods. The source and drain regions 23 and 24 are then implanted using polysilicon gate 28 as a mask. Source, drain and substrate contacts are then provided to form the transistor 60 of FIG. 6.

An important aspect of the process illustrated in FIGS. 15A–15E is the utilization of a thin epitaxial layer of silicon 76 to form the third tub 66. Those skilled in the art will recognize that very similar vertical profiles may be obtained without the expense or complexity of epitaxy, and workable Vinal-FET devices may be constructed in this manner. However, epitaxy is preferably used in order to maximize the conduction carrier mobility in the channel region 66a.

As in traditional Fermi-FET devices, and to a lesser extent "buried channel" FET transistors, the lowered vertical field of the Vinal-FET reduces the effective mobility loss by conduction carriers at the silicon surface. The Fermi-FET and Vinal-FET improve the effective mobility still further by having the conduction carriers flow in an area where they are the majority carrier type and the net doping concentration is lower than a conventional MOSFET. The Vinal-FET can further improve effective mobility by eliminating the need to counterdope the channel region 66a.

Net carrier mobility is generally a result of several different mechanisms including phonon scattering, lattice defects, surface roughness, and total impurity concentration. A conduction carrier flowing between the source and drain regions of a field effect device will experience collisions of several different types, each with a probability set by various architectural details of the device and applied voltages. Each mechanism will have an average time between scattering events, τ. The total probability of a collision occurring during a time interval is then the combination of each individual scattering mechanism probability:

$$\frac{dt}{\tau_T} = \sum_i \frac{dt}{\tau_i} \qquad (12)$$

where i represents each individual scattering mechanism. Therefore the total average time between scattering events is smaller than the smallest of the individual probabilities due to the constituent causes. Mobility can be related to the probability of scattering by:

$$\mu = \frac{q}{m^*} \tau \qquad (13)$$

Thus, the total mobility is related to the mobility associated with each individual scattering mechanism as:

$$\frac{1}{\mu} = \sum_i \frac{1}{\mu_i} \qquad (14)$$

As noted with the scattering lifetimes, the total carrier mobility is smaller than the smallest of the individual mobilities due to the constituent causes. When one of the individual mechanism mobilities becomes small compared to the others, it then becomes the dominant mechanism and reduces the relative contribution of the others.

Figure 16:
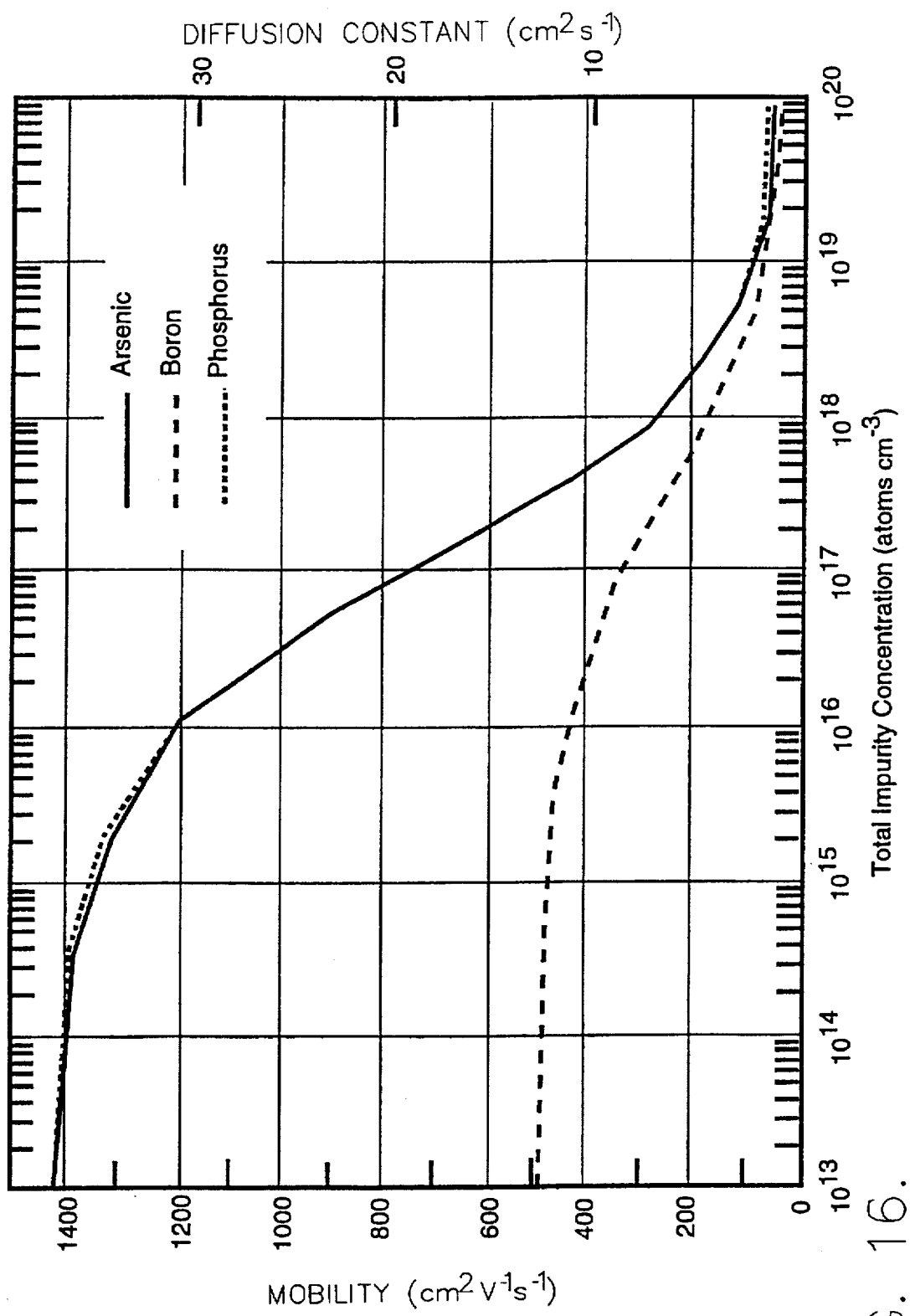
FIG. 16 graphically illustrates carrier mobility in silicon as a function of total impurity concentration.

In current sub-micron devices, the scattering due to dopant atoms has become such a dominant mechanism. Extreme short channel transistors have reached the point where the doping level in the channel, required to allow device turn off, has become the limiting factor. FIG. 16 depicts the carrier (electron and hole) mobility in silicon at 300° C. as a function of the total impurity concentration of the three main dopant elements, from "*Device Electronics for Integrated Circuits*, Second Edition" by Richard S. Muller and Theodore I. Kamins, p. 33, (1986). In surface channel MOSFET devices, with channel lengths of 0.25 μm, it is common to see total channel doping above $2 \times 10^{18}.cm^{-3}$. This leads to a substantial loss in performance compared to lower concentrations used for longer devices.

Referring again to FIG. 11, the mobility μ associated with a channel doping of $2 \times 10^{18}.cm^{-3}$ is $235 cm^2/V.sec$. N-channel Vinal-FET transistors with channel lengths in the deep sub-micron range would require a net N-type dopant concentration of $5.0 \times 10^{16}$ to $2.0 \times 10^{17}$ in the third tub region where conduction takes place. Using ion implantation to form the third tub would typically require counterdoping the DFT layer (about $4 \times 10^{17}$ P-type) to the net N-type level above. Neglecting non-doping related causes and assuming tub doping is set to $5.0 \times 10^{16}$, the net channel mobility obtained from FIG. 13 assuming the P dopant was $4 \times 10^{17}$ and the N dopant=$4.5 \times 10^{17}$ (counterdoped +$5.0 \times 10^{16}$) would be $320 cm^2/V.sec$. This mobility is better than the MOSFET above, but better performance is possible. In particular, utilizing the process described in FIGS. 15A–15E, the P-type doping in the DFT region 64a has negligible presence in the third epitaxially formed tub 66, allowing the net and total doping in the third tub region to be $5.0 \times 10^{16}$. Thus, the mobility is greatly increased to $900 cm^2/V.sec$.

High Performance MOSFETs

Figure 17:
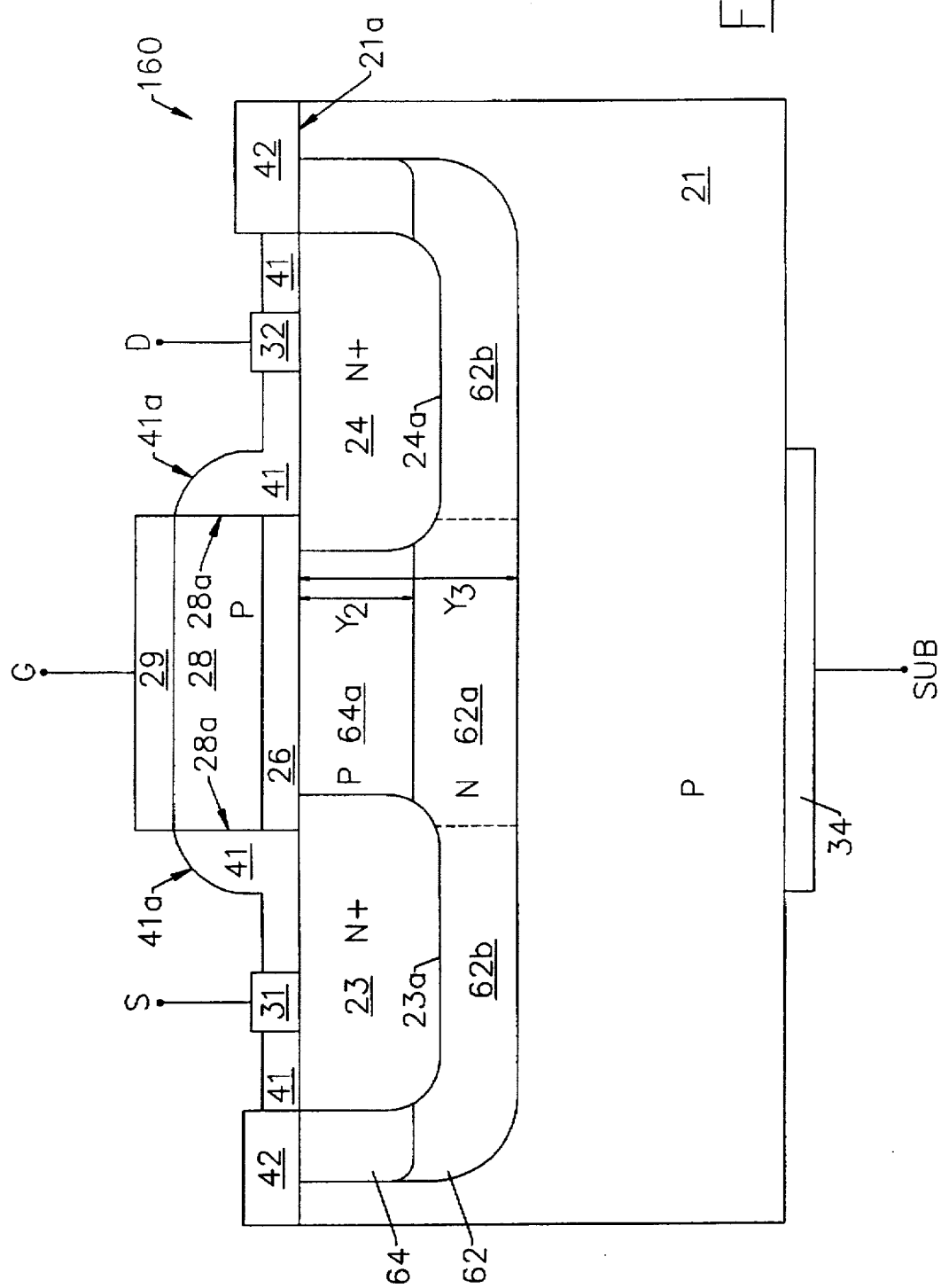
FIGS. 17 and 18 are cross-sectional illustrations of high performance MOSFETs according to the present invention.
Figure 18:
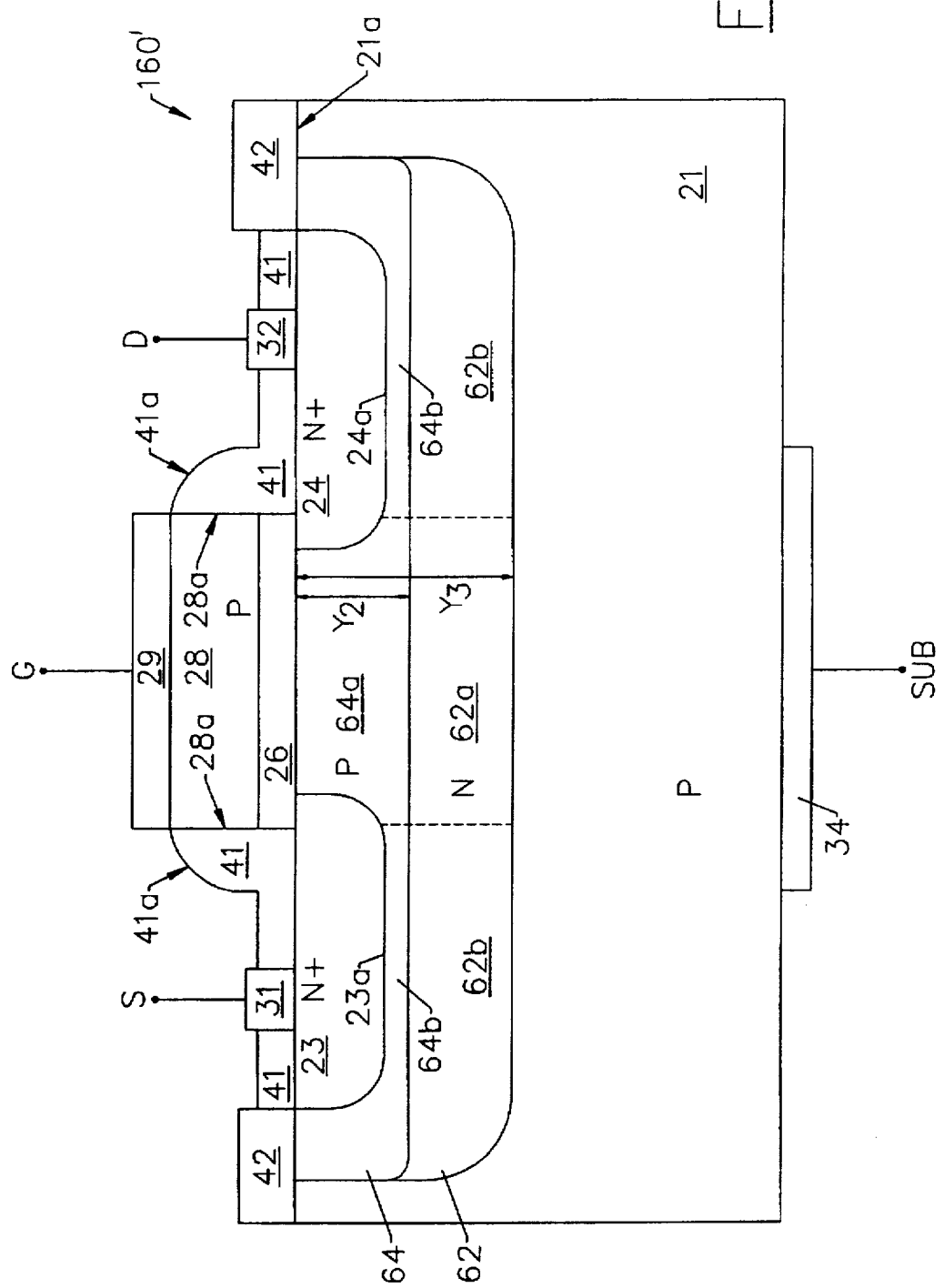

Drain field termination regions of the Vinal-FET may also be applied to a conventional MOSFET design with a counterdoped channel. FIGS. 17 and 18 illustrate two embodiments of conventional MOSFET embodying a second (DFT) tub 64 and first tub 62. FIGS. 17 and 18 may also be viewed as a Vinal-FET with the third tub 66 missing. Alternatively, FIGS. 17 and 18 may be viewed as conventional MOSFETs with an added first tub 62. Although not generally performing as well as a Vinal-FET, improved performance for short channel MOSFETs may be obtained with the structures of FIGS. 17 and 18.

Summary of Design Criteria for Vinal-FET

The following provides a summary of the design criteria for a Vinal-FET according to the invention. As the equations utilized herein assumed constant dopant profiles and completely abrupt transistors, simulations and/or empirical data are preferably used to optimize the device: $Y_3–Y_2$: The vertical extent of the first tub region, defined explicitly in Equation 11 as a function of DFT, substrate, and first tub doping densities. $Y_2–Y_1$: The vertical extent of the DFT region. Wide latitude is possible for this parameter with little effect on transistor performance. A useful starting point for optimization is 150% of the value of $Y_1$. $Y_1$: The vertical extent of the second tub region. Also subject to wide possible variations, with smaller numbers generally required for higher operating voltages ($V_d$) or narrower channels ($L_{eff}$). A useful starting point for optimization is:

$$Y_1 = \frac{5.5(L_{eff})}{\sqrt{V_{d\,max}}} \qquad (15)$$

$N_{DFT}$: The average doping concentration of the DFT region is a function of the maximum drain voltage, defined in Equation (7) as a function of the effective channel length $L_{eff}$.

$N_{FT}$: The average doping concentration of the first tub region is a function of $N_{DFT}$ and $N_{sub}$, the substrate concentration, defined in Equation (11).

$N_{TT}$: The average doping concentration of the third tub region or "Fermi-tub" is generally set to $1 \times 10^{16}$ for long channel (>1 μm) and is generally increased as the channel is shortened. For example, at 0.25 μm, $N_{TT}$ is approximately $1 \times 10^{17}$. Simulations of leakage current may be utilized to "tune" this concentration for leakage.

$N_{poly}$: Polysilicon doping generally plays a weak role in the threshold voltage, but for reasons of process stability and complexity, it is usually left at $\approx 1 \times 10^{20}$.

Table of Variables Used $C_g$: Gate Capacitance; dQ/dV of the gate electrode.

$Y_f$: Depth of the Conduction Channel; region under the gate oxide where conduction carriers flow between the source and drain when the transistor is fully on.

β Carrier depth factor; a mathematical coefficient that relates $Y_f$ to the average carrier depth.

$\epsilon_s$: Permittivity of substrate.

$\epsilon_i$: Permittivity of the insulating dielectric between the polysilicon gate electrode and the substrate.

$T_{ox}$: Thickness of the insulating dielectric between the polysilicon gate electrode and the substrate.

Z: Width of an FET transistor normal to a line from the source to the drain.

$Y_o$: The depth of the Fermi-tub. The distance from the substrate surface, under the gate electrode, to the metallurgical junction formed between the Fermi-tub and the well.

$Y_1$: The distance normal to the silicon surface from the substrate surface, under the gate electrode midway between the source and drain diffusions, to the metallurgical junction formed between the second Fermi-tub (surface layer of second conductivity type) and the DFT Region.

$Y_2$: The distance normal to the substrate surface from the substrate surface, under the gate electrode, to the metallurgical junction formed between the first Fermi-tub (bottom layer of second conductivity type) and the DFT Region.

$Y_3$: The distance normal to the substrate surface from the substrate surface, under the gate electrode, to the metallurgical junction formed between the first Fermi-tub (bottom layer of second conductivity type) and the well region or substrate.

$N_{DFT}$: The average doping level in the Drain Field Termination (DFT) region, also referred to as (N64).

$N_{FT}$: The average doping level in the first tub region (62a in FIGS. 6 or 7), also referred to as (N62).

$V_a$: Voltage applied to an arbitrary source or drain terminal in the transistor.

$V_a \, V_d \, V_g \, V_s$: Voltage applied to the source, drain, gate, or substrate respectively.

$\phi_b$: The built-in potential of a pn junction (see Equation (6)).

$W_{DFT.FT}$: The vertical extent of the depletion region formed by the pn junction where the DFT region (64a) and the first tub region (62a) meet.

$W_{FT.sub}$: The vertical extent of the depletion region formed by the pn junction where the substrate (21) and the first tub region (62a) meet.

$L_{ef}$: The shortest distance parallel to the substrate surface, from the edge of the source to the edge of the drain diffusions. Same as L66a.

$L_o$: The width of the polysilicon gate electrode measured parallel to the direction of current flow. Same as L2.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A field effect transistor comprising:
a semiconductor substrate of first conductivity type;
a first tub region of second conductivity type in said substrate at a surface thereof, extending into said substrate to a first depth from said substrate surface;
a second tub region of said first conductivity type in said first tub region, extending into said substrate to a second depth from said substrate surface, wherein said second depth is less than said first depth;
a third tub region of said second conductivity type in said second tub region, extending into said substrate to a third depth from said substrate surface, wherein said third depth is less than said second depth;
spaced apart source and drain regions of said second conductivity type in said first tub region, extending into said substrate to a fourth depth from said substrate surface, wherein said fourth depth is greater than said third depth;
a gate insulating layer on said substrate surface, between said spaced apart source and drain regions; and
source, drain and gate electrodes contacting said source and drain regions and said gate insulating layer, respectively.

2. A field effect transistor according to claim 1 wherein said fourth depth is also greater than said second depth.

3. A field effect transistor according to claim 2 wherein said fourth depth is also less than said first depth.

4. A field effect transistor according to claim 1 wherein said fourth depth is also less than said first depth.

5. A field effect transistor according to claim 1 wherein said gate electrode includes a polycrystalline silicon layer of said first conductivity type.

6. A field effect transistor comprising:
a semiconductor substrate of first conductivity type;
spaced apart source and drain regions of second conductivity type in said substrate at a surface thereof;
a first layer of said second conductivity type in said substrate at said substrate surface, extending from said source region to said drain region and extending into said substrate to a first depth from said substrate surface;
a second layer of said first conductivity type in said substrate, extending from said source region to said drain region and extending into said substrate from said first depth to a second depth from said substrate surface;
a third layer of said second conductivity type in said substrate, extending from said source region to said drain region and extending into said substrate from said second depth to a third depth from said substrate surface;
a gate insulating layer on said substrate surface, between said spaced apart source and drain regions; and
source, drain and gate electrodes contacting said source and drain regions and said gate insulating layer, respectively.

7. A field effect transistor according to claim 6 wherein said source and drain regions include source and drain bottoms in said semiconductor substrate, and wherein said second and third layers extend from said source bottom to said drain bottom.

8. A field effect transistor according to claim 6 wherein said source and drain regions include source and drain bottoms in said semiconductor substrate, and wherein said third layer extends from said source bottom to said drain bottom.

9. A field effect transistor according to claim 6 wherein said gate electrode includes a polycrystalline silicon layer of said first conductivity type.

10. A field effect transistor comprising:
a semiconductor substrate of first conductivity type;
a tub region of second conductivity type in said substrate at a surface thereof;
spaced apart source and drain regions of said second conductivity type in said tub region at said substrate surface;
a buried region of said first conductivity type in said tub region and extending beneath said substrate surface from said source region to said drain region;
a gate insulating layer on said substrate surface, between said spaced apart source and drain regions;
source, drain and gate electrodes contacting said source and drain regions and said gate insulating layer, respectively;
wherein said source and drain regions include source and drain bottoms in said semiconductor substrate, and wherein said buried region further extends from said source bottom to said drain bottom.

11. A field effect transistor according to claim 10 wherein said gate electrode includes a polycrystalline silicon layer of said first conductivity type.

12. A field effect transistor comprising:

a semiconductor substrate of first conductivity type;

spaced apart source and drain regions of second conductivity type in said substrate at a surface thereof;

a first layer of said second conductivity type in said substrate at said substrate surface, extending from said source region to said drain region;

a buried second layer of said first conductivity type in said first layer, extending beneath said substrate surface from said source region to said drain region;

a gate insulating layer on said substrate surface, between said spaced apart source and drain regions;

source, drain and gate electrodes contacting said source and drain regions and said gate insulating layer, respectively;

wherein said source and drain regions include source and drain bottoms in said substrate, and wherein said first layer further extends from said source bottom to said drain bottom.

13. A field effect transistor according to claim 12 wherein said source and drain regions include source and drain bottoms in said substrate, and wherein said first layer and said buried second layer both extend from said source bottom to said drain bottom.

14. A field effect transistor according to claim 12 wherein said gate electrode includes a polycrystalline silicon layer of said first conductivity type.

* * * * *